US012751008B2

(12) United States Patent
Lee et al.

(10) Patent No.: US 12,751,008 B2
(45) Date of Patent: Sep. 29, 2026

(54) 3D SYNAPSE DEVICE STACK, 3D STACKABLE SYNAPSE ARRAY USING THE 3D SYNAPSE DEVICE STACKS AND METHOD OF FABRICATING THE STACK

(71) Applicant: Seoul National University R&DB FOUNDATION, Seoul (KR)

(72) Inventors: Jong-Ho Lee, Seoul (KR); Young-tak Seo, Seongnam-si (KR); Soochang Lee, Seoul (KR); Seongbin Oh, Seoul (KR); Jangsaeng Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 1049 days.

(21) Appl. No.: 17/888,770

(22) Filed: Aug. 16, 2022

(65) Prior Publication Data

US 2023/0059685 A1 Feb. 23, 2023

Related U.S. Application Data

(60) Provisional application No. 63/233,939, filed on Aug. 17, 2021.

(51) Int. Cl.
*H10B 43/27* (2023.01)
*G06N 3/063* (2023.01)
(Continued)

(52) U.S. Cl.
CPC ............ *H10B 43/27* (2023.02); *G06N 3/063* (2013.01); *G11C 16/08* (2013.01); *H10B 43/35* (2023.02);
(Continued)

(58) Field of Classification Search
CPC ............................ H10B 43/27; G11C 2213/71
See application file for complete search history.

(56) References Cited

U.S. PATENT DOCUMENTS 10,593,697 B1 * 3/2020 Hu ......................... H10B 43/10
2021/0408046 A1 * 12/2021 Chang ................. G11C 11/2255
2022/0036931 A1 * 2/2022 Lin .......................... G11C 8/14

OTHER PUBLICATIONS

Si, et al., A Twin-8T SRAM Computation-In-Memory Macro for Multiple-Bit CNN-Based Machine Learning, 2019 IEEE International Solid-State Circuits Conference.

(Continued)

*Primary Examiner* — Chad M Dicke
*Assistant Examiner* — Valerie N Newton
(74) *Attorney, Agent, or Firm* — CANTOR COLBURN LLP

(57) ABSTRACT

Provided is a 3D synapse device stack, a 3D stackable synapse array using the same, and a method for manufacturing the 3D synapse device stack. The 3D synapse device stack comprises: a channel hole provided along a vertical direction on a substrate; a semiconductor body formed by applying a semiconductor material to the surface of the channel hole; first insulating layers and sources alternately stacked on a first side surface of an outer circumferential surface of the semiconductor body; first insulating layers and drains alternately stacked on a second side surface of an outer circumferential surface of the semiconductor body; a source line electrode connected to and in contact with a plurality of sources; a drain line electrode connected to and in contact with the plurality of drains; a plurality of word lines alternately stacked with first insulating layers on a third side surface of an outer circumferential surface of the semiconductor body; and a plurality of insulator stacks positioned between the word lines and the semiconductor body, wherein the semiconductor body, the source, the drain, the insulator stack, and the word line positioned on the same layer on the surface of the channel hole constitute a synapse device or a part thereof. The synapse device stack may implement an AND-type or NOR-type synapse array.

12 Claims, 31 Drawing Sheets

(51) Int. Cl.

| | |
|---|---|
| ***G11C 16/08*** | (2006.01) |
| ***H10B 43/35*** | (2023.01) |
| ***H10B 43/40*** | (2023.01) |
| ***H10B 51/20*** | (2023.01) |
| ***H10B 51/40*** | (2023.01) |
| *G11C 16/04* | (2006.01) |

(52) U.S. Cl.

CPC ............. *H10B 43/40* (2023.02); *H10B 51/20* (2023.02); *H10B 51/40* (2023.02); *G11C 16/0483* (2013.01)

(56) References Cited

OTHER PUBLICATIONS

Sun, et al., XNOR-RRAM: A Scalable and Parallel Resistive Synaptic Architecture for Binary Neural Networks, Design, Automation And Test in Europe, 2018.

* cited by examiner

[FIG. 3A]
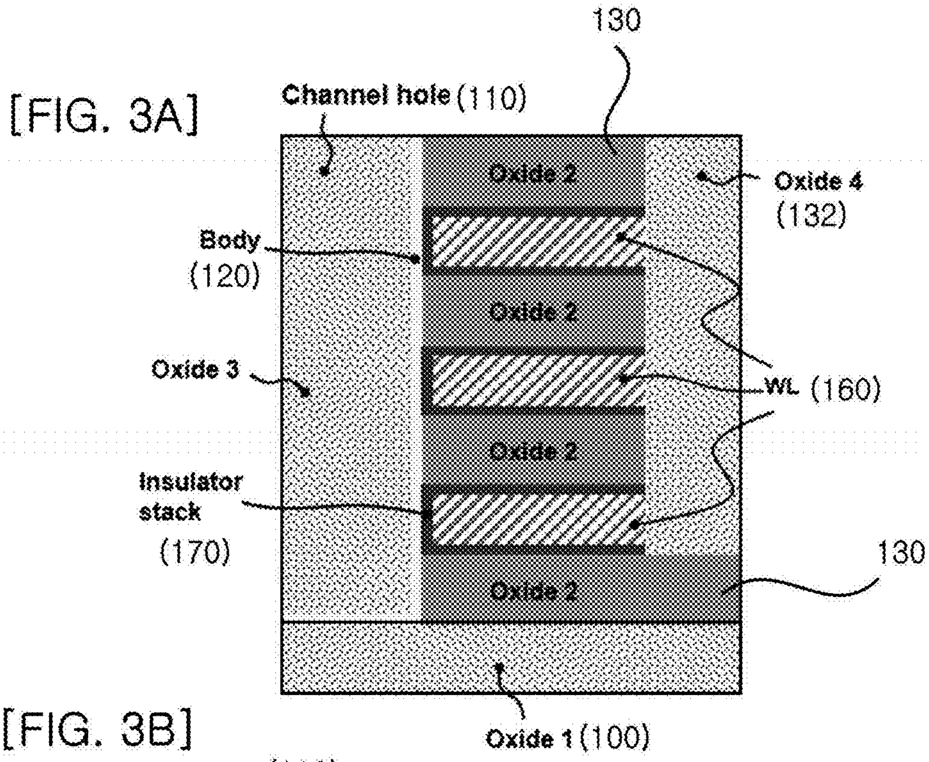
[FIG. 3B]
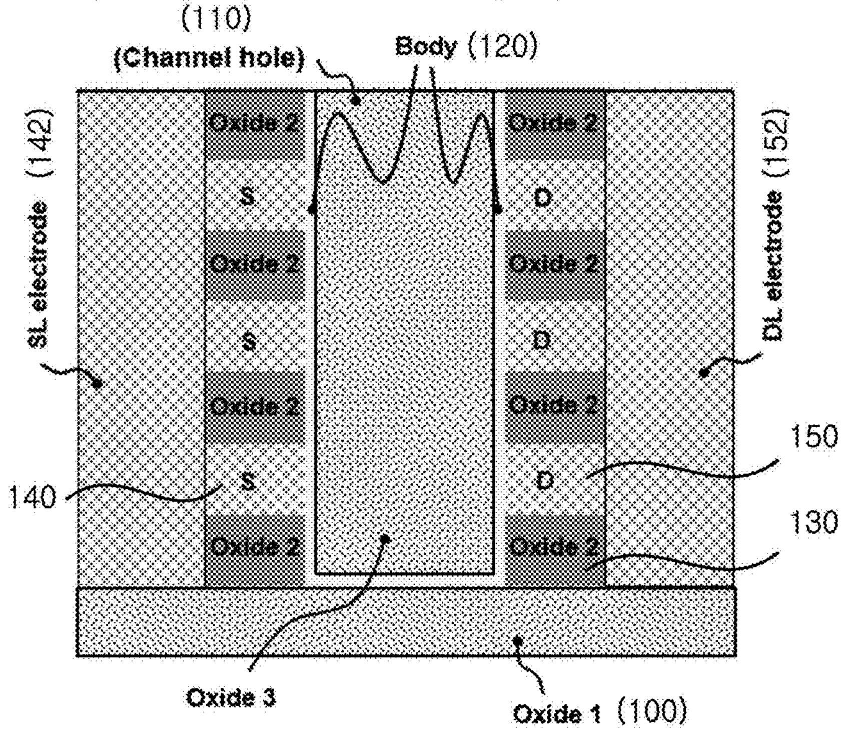

[FIG. 6A]
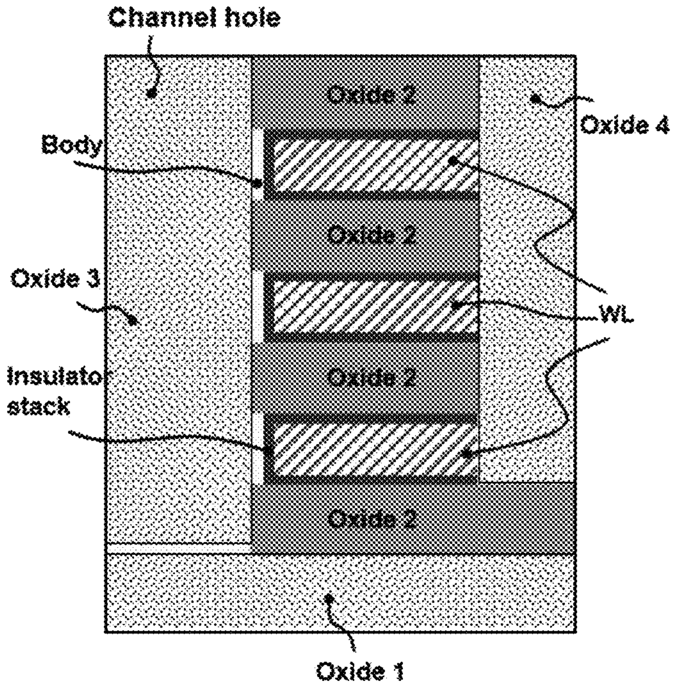
[FIG. 6B]
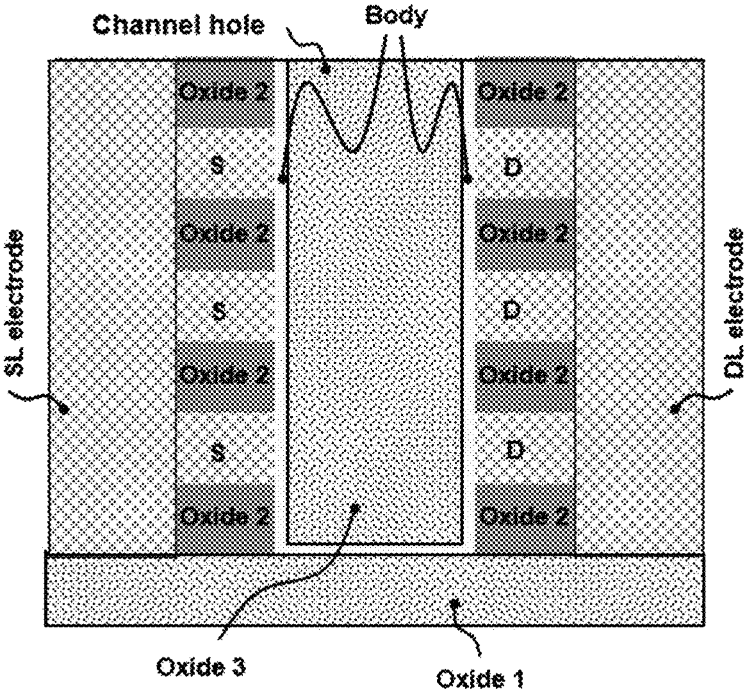

[FIG. 8A]
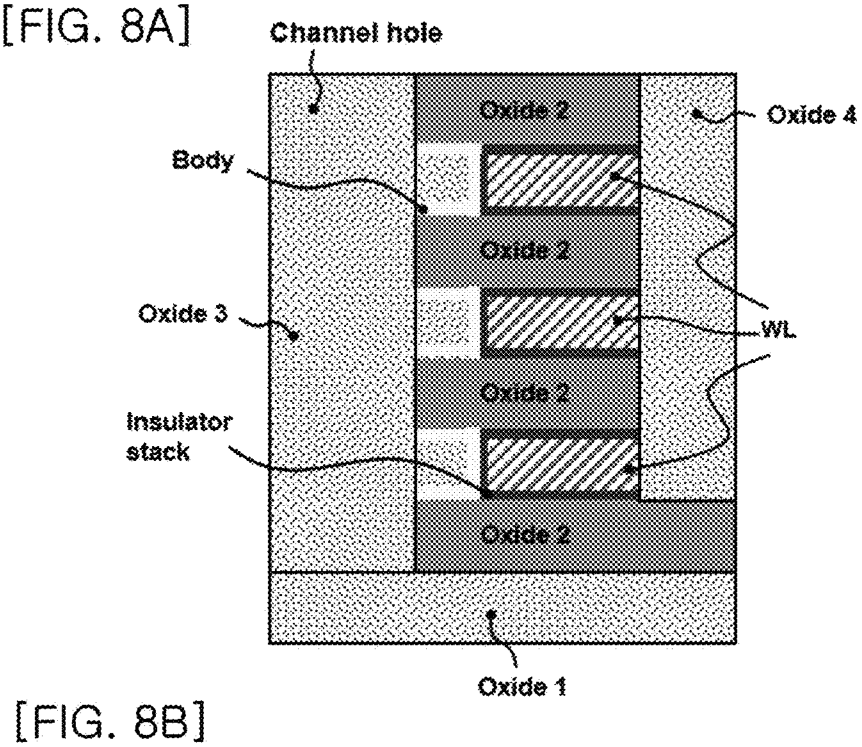
[FIG. 8B]
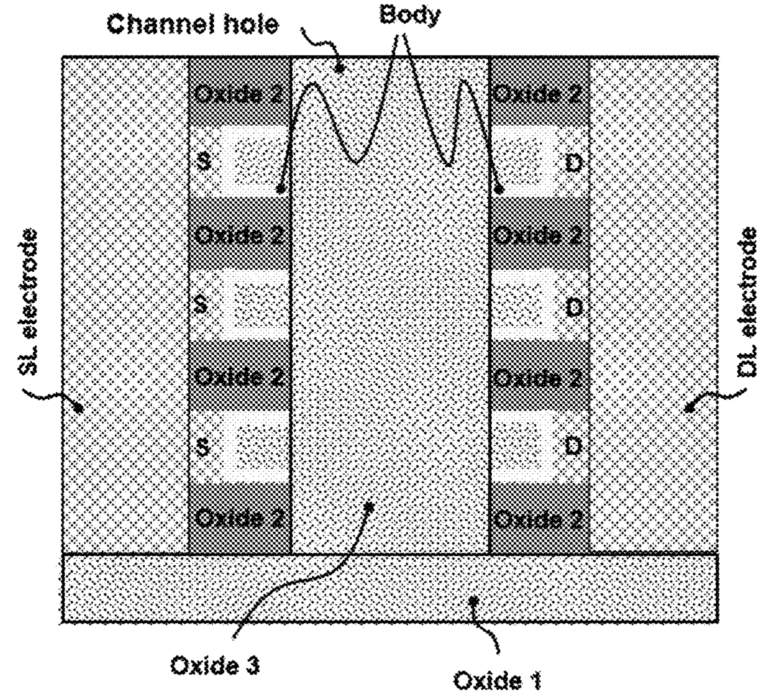

[FIG. 10A]
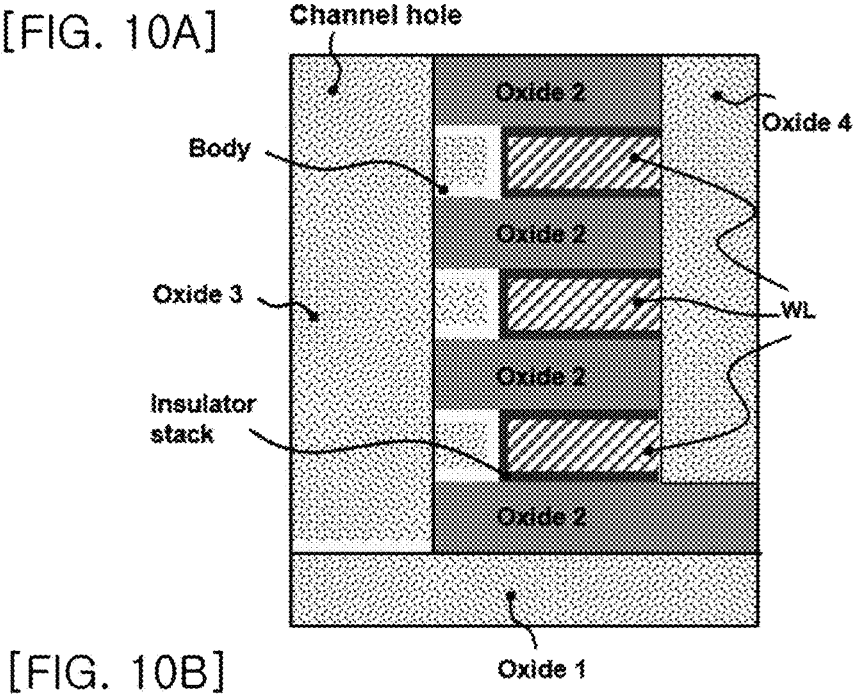
[FIG. 10B]
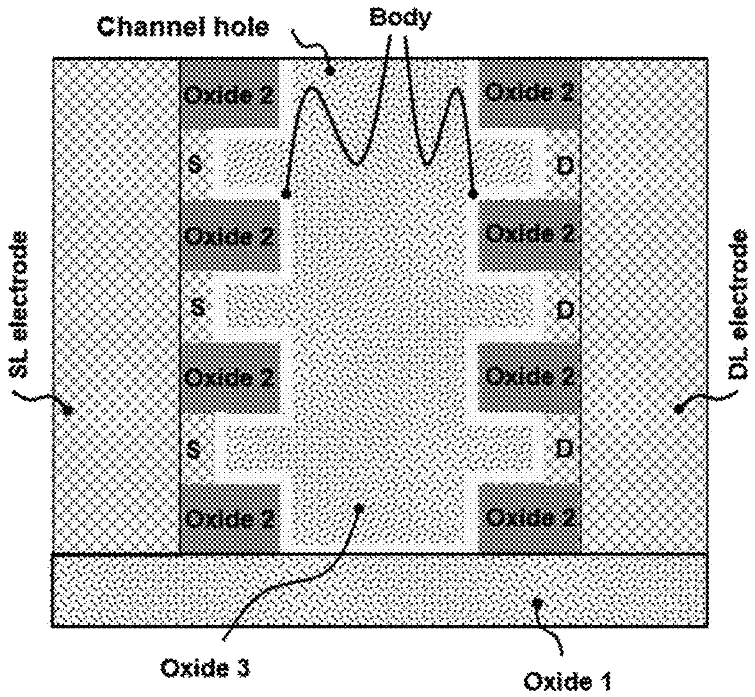

[FIG. 12A]
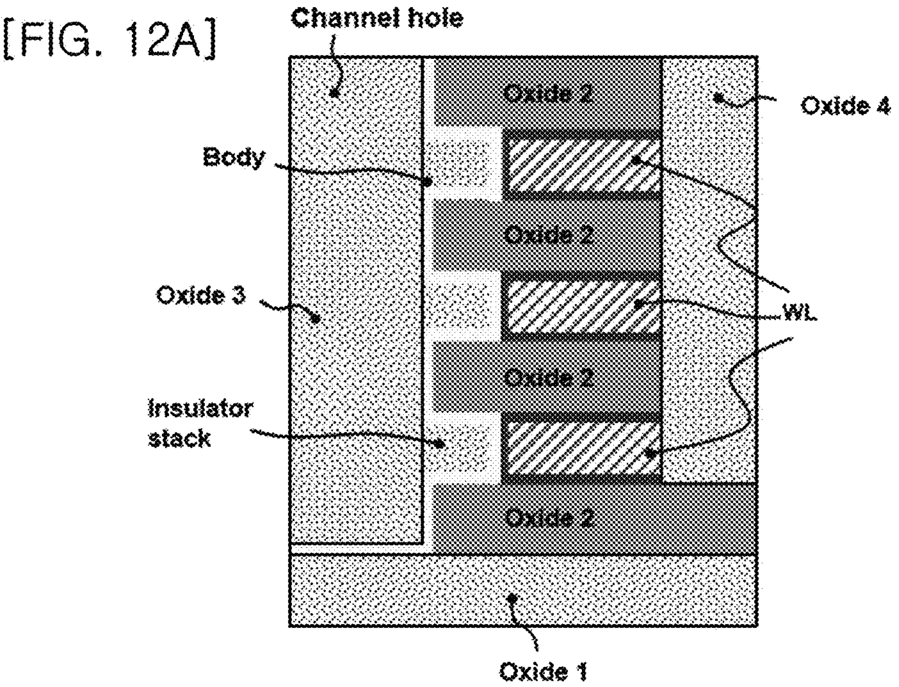
[FIG. 12B]
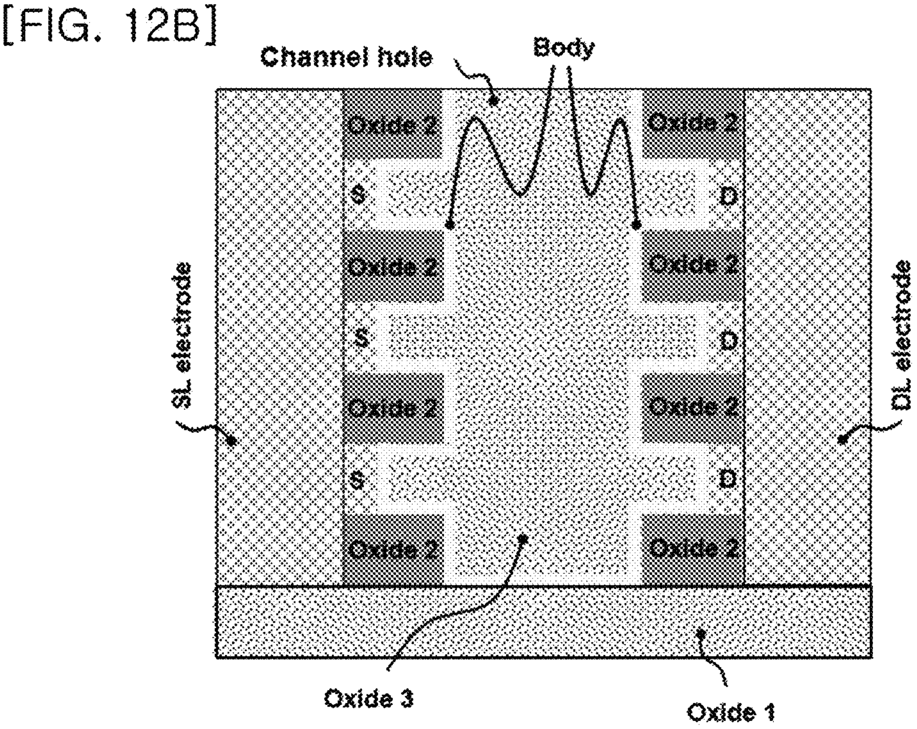

[FIG. 13A]
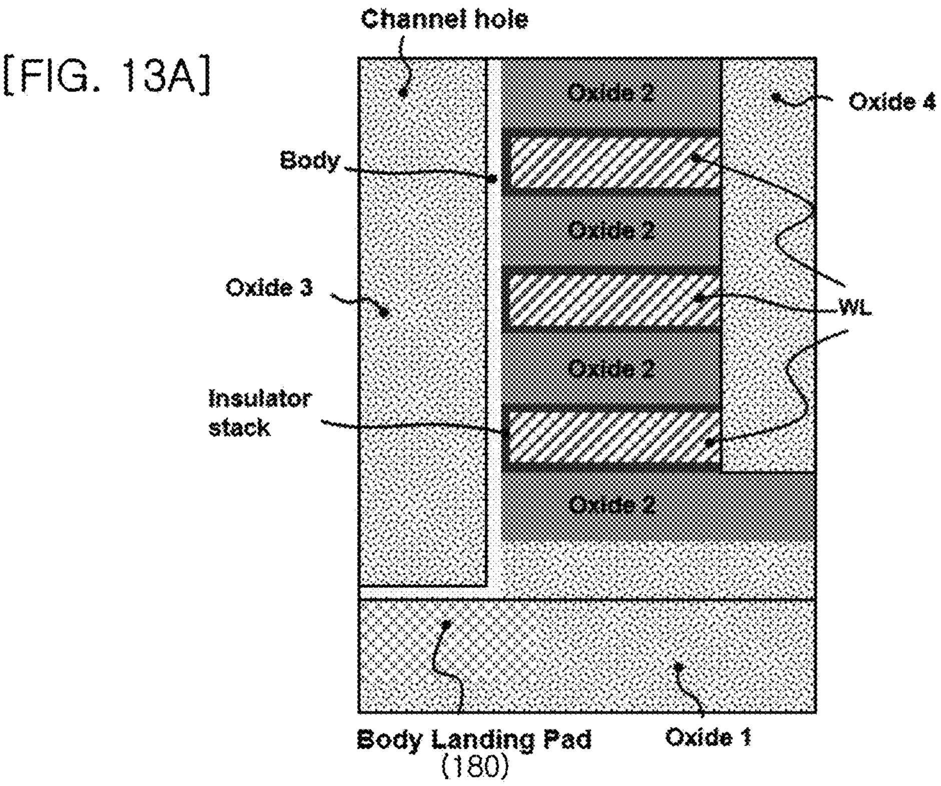
[FIG. 13B]
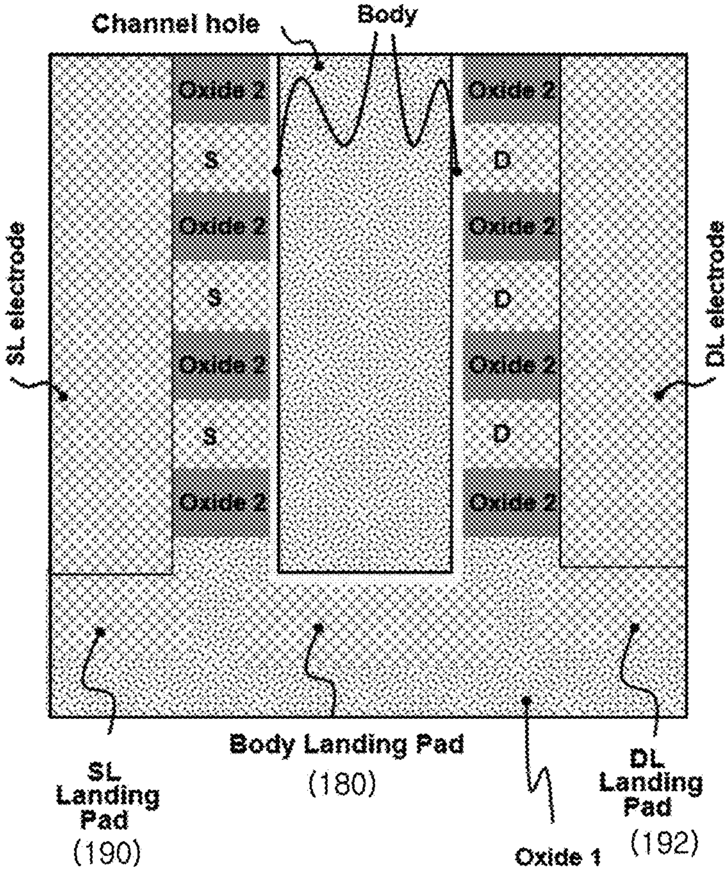

[FIG. 14A]
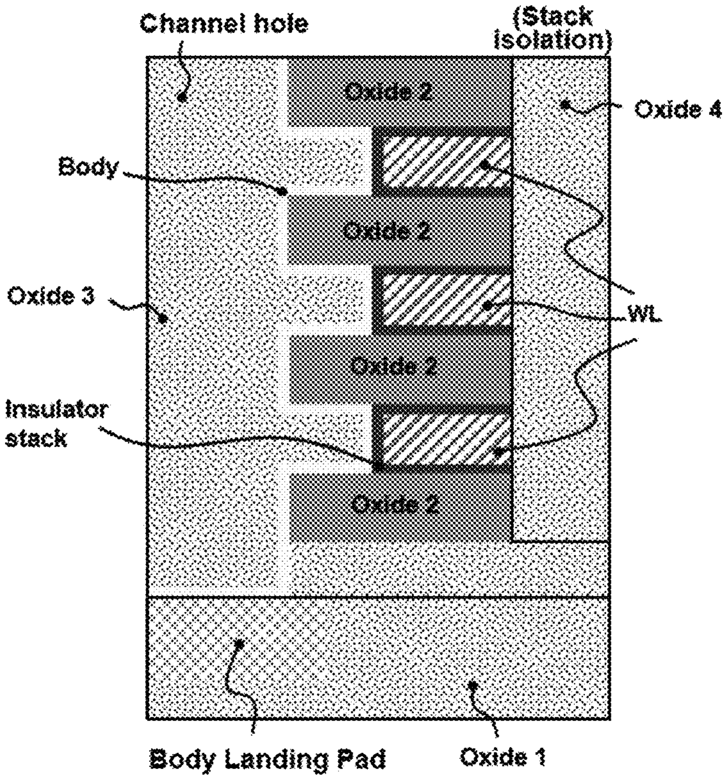
[FIG. 14B]
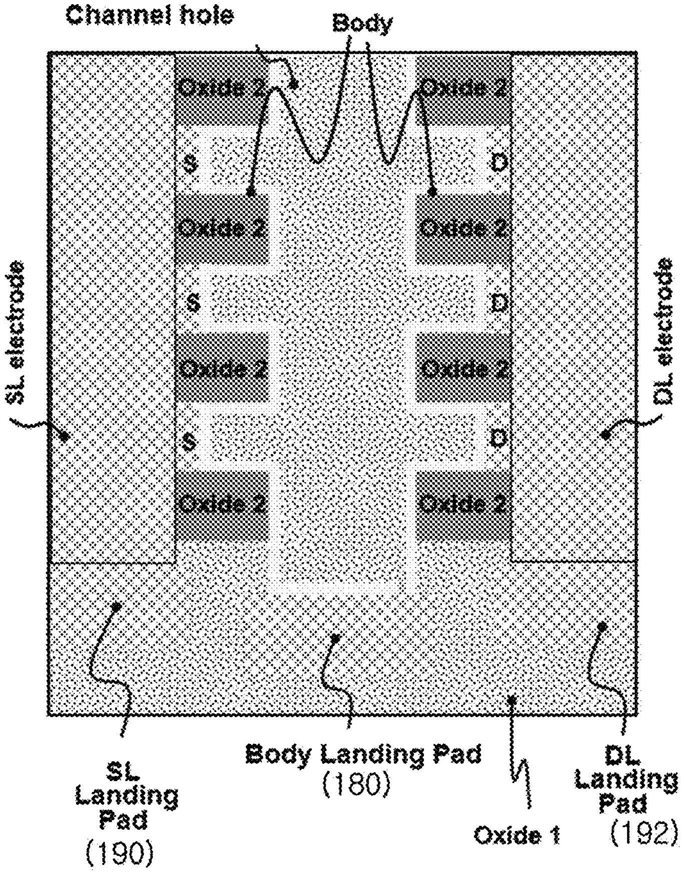

[FIG. 15A]
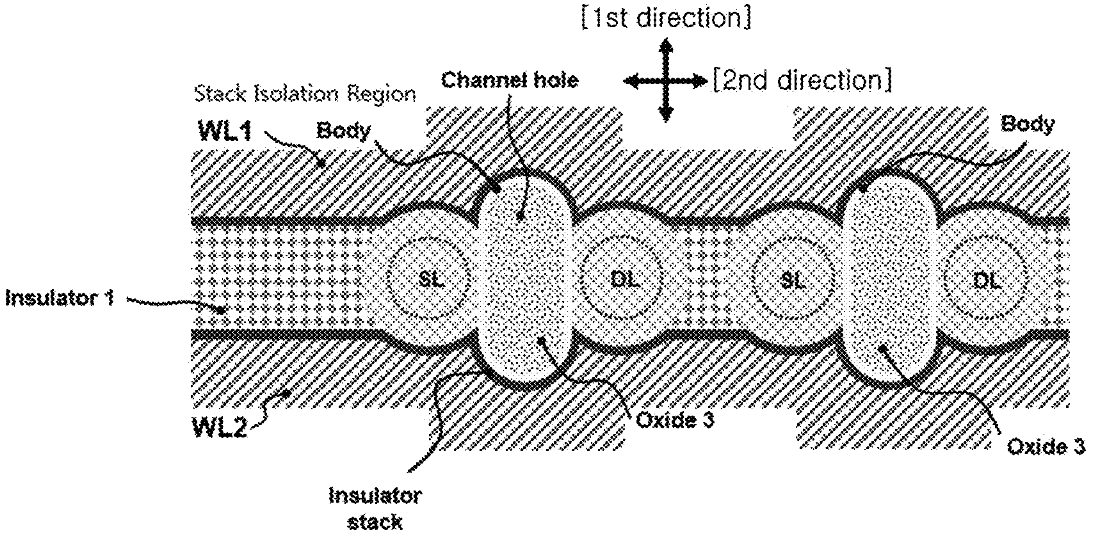
[FIG. 15B]
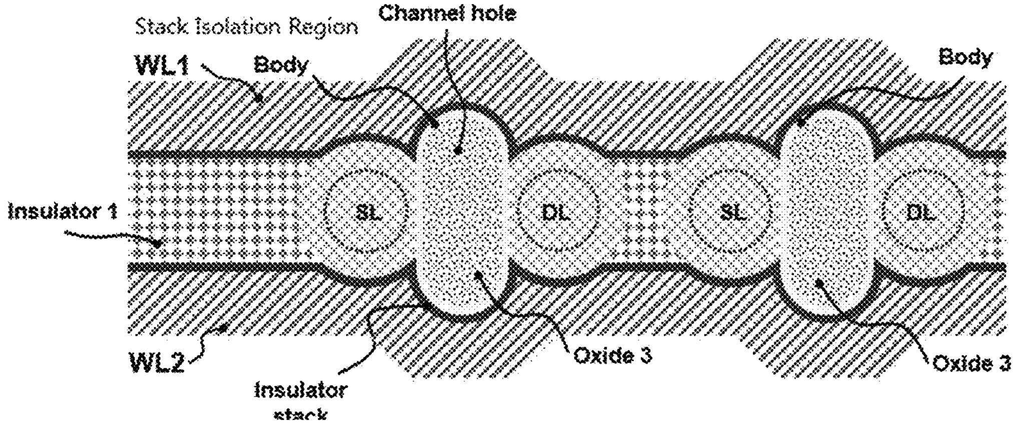

[FIG. 16A]
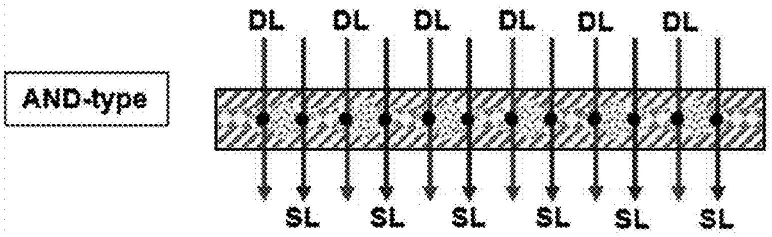
[FIG. 16B]
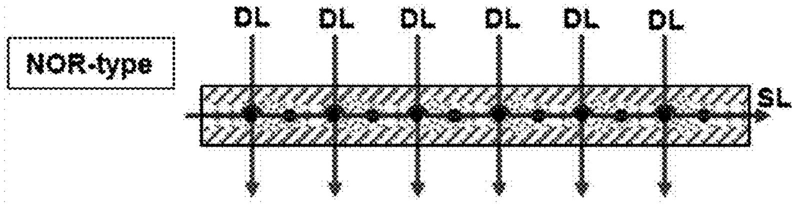

[FIG. 17A]
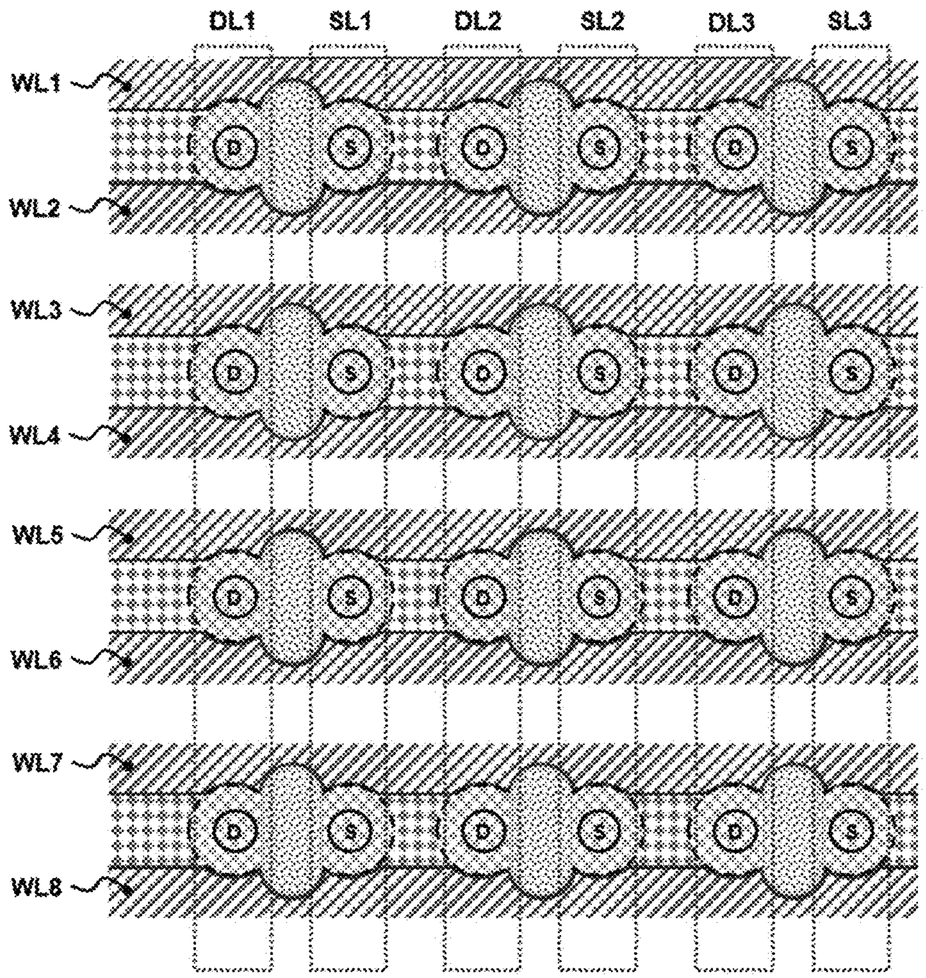
[FIG. 17B]
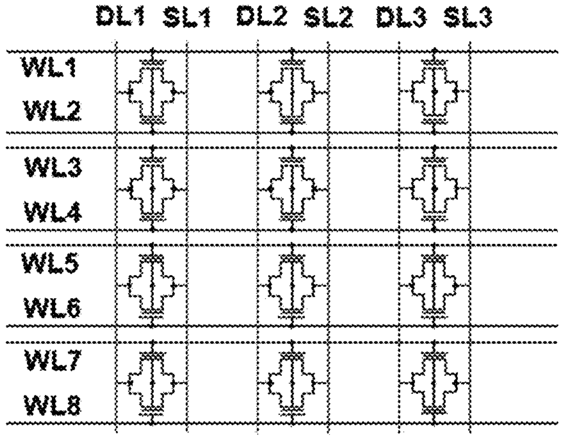

[FIG. 18A]
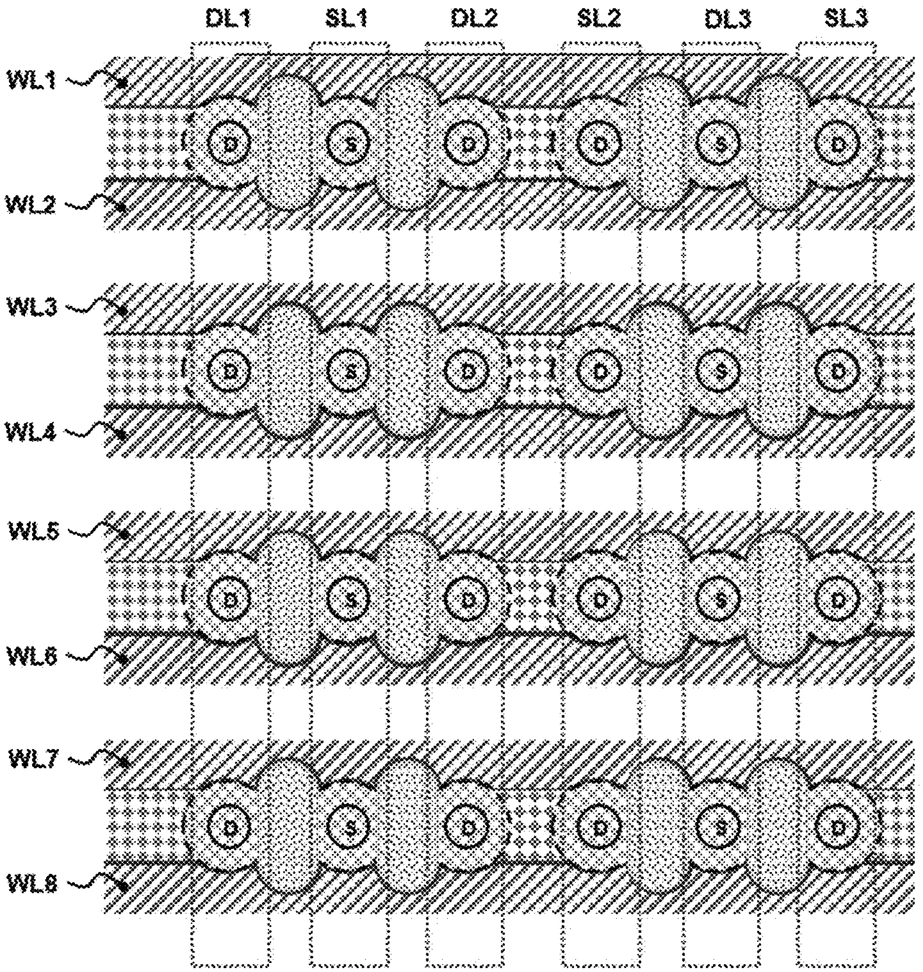
[FIG. 18B]
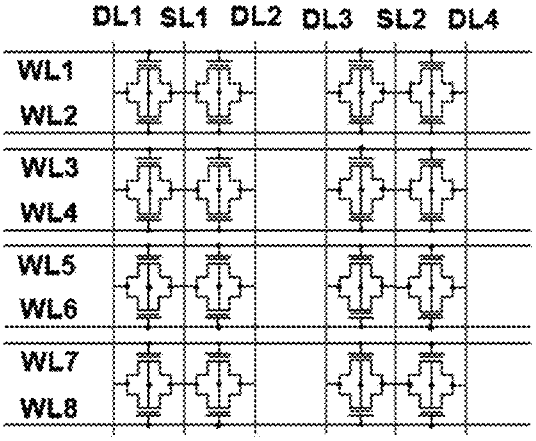

[FIG. 19A]
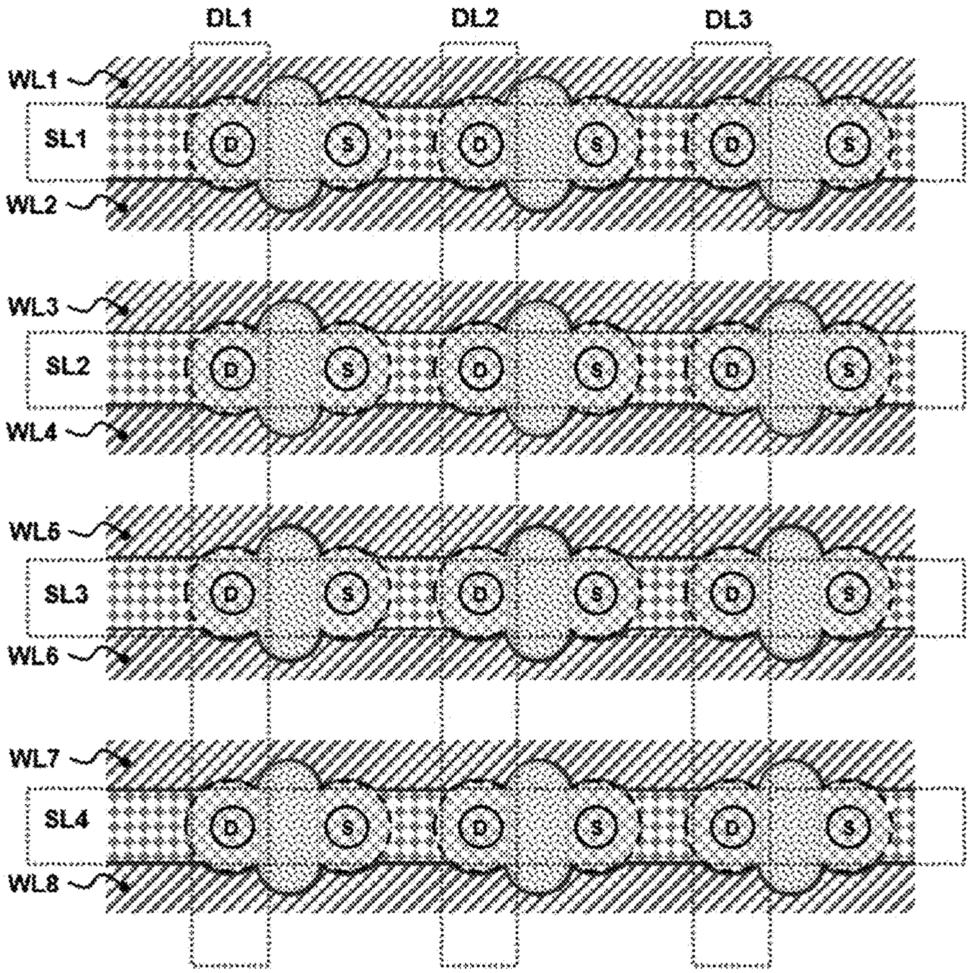
[FIG. 19B]
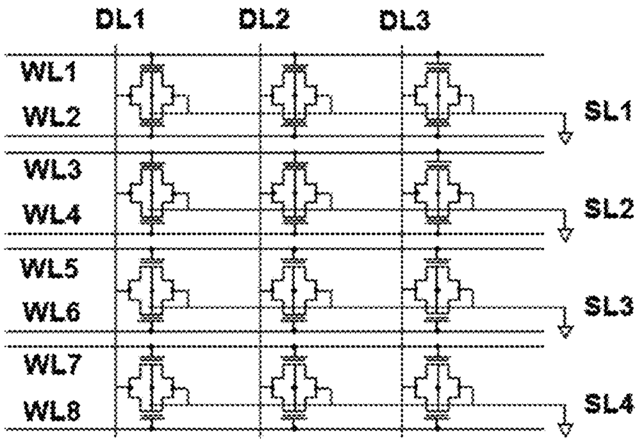

[FIG. 20A]
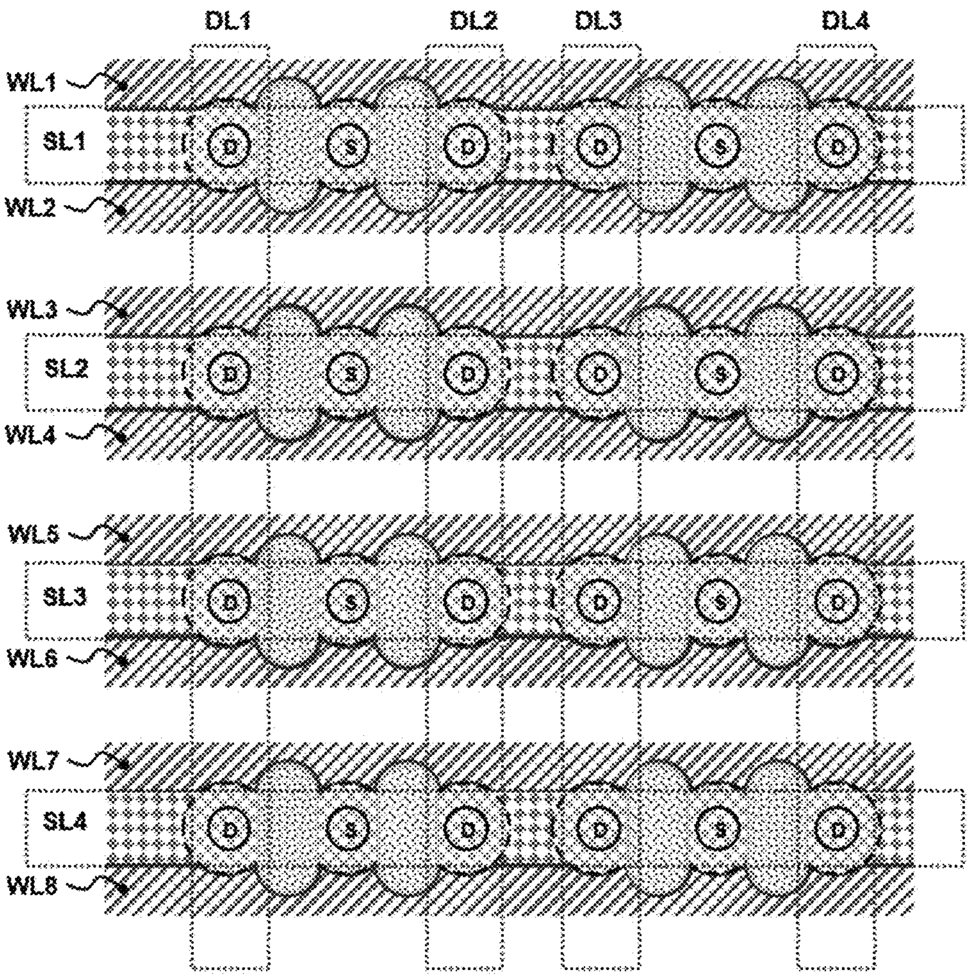
[FIG. 20B]
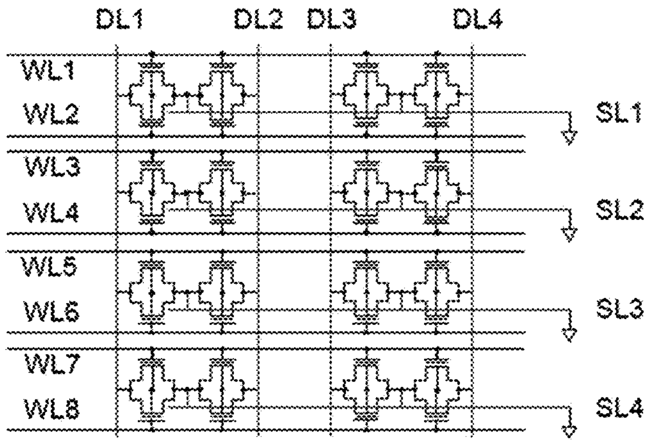

[FIG. 21A]
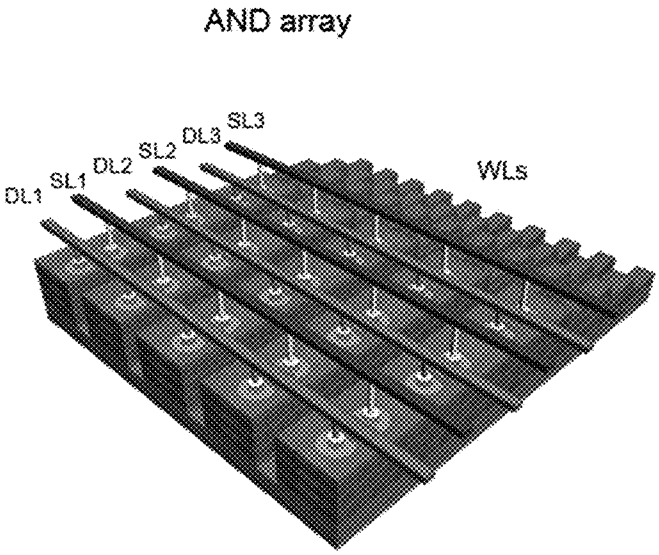
[FIG. 21B]
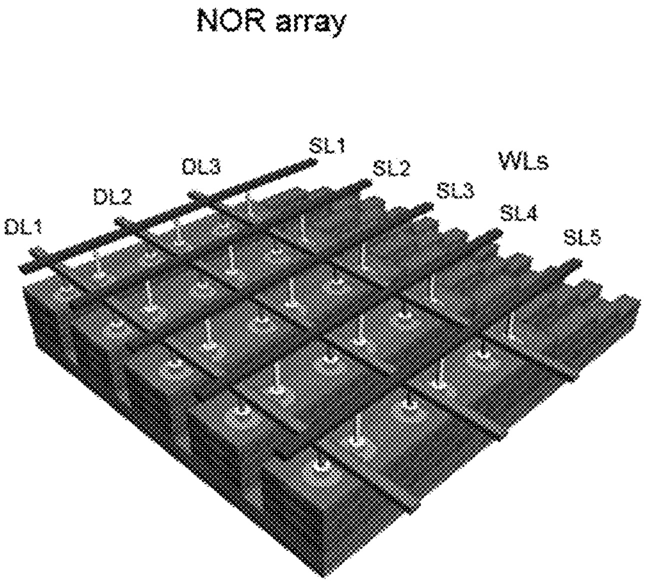

[FIG. 24A]
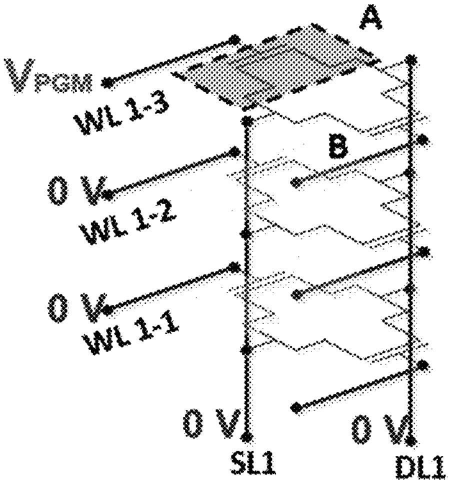
[FIG. 24B]
| FN Program | WL | DL & SL |
|---|---|---|
| Selected | $V_{PGM}$ (8 V) | 0 V |
| Unselected | 0 V | 0 V |

[FIG. 25A]
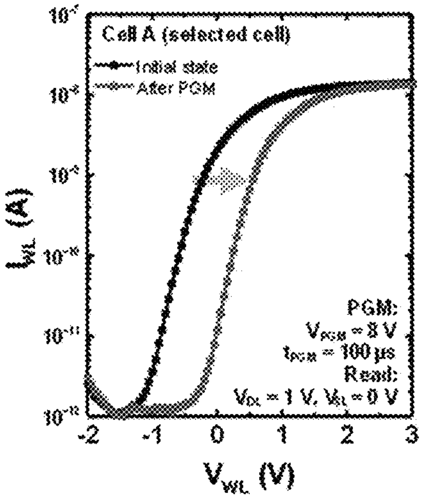
[FIG. 25B]
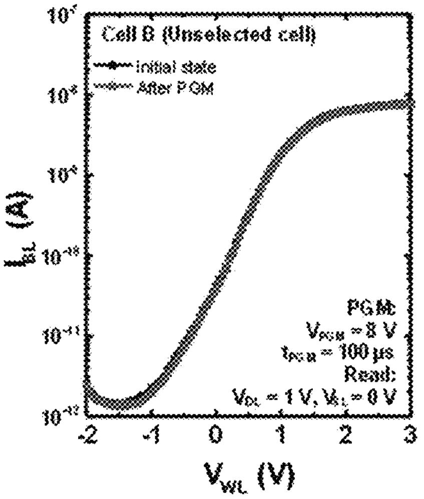

[FIG. 26A]
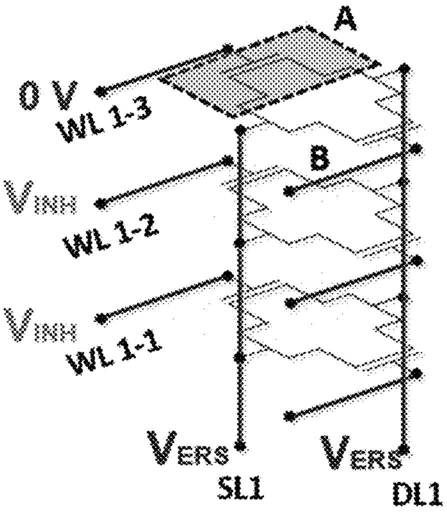
[FIG. 26B]
| GIDL Erase | WL | DL & SL |
|---|---|---|
| Selected | 0 V | $V_{ERS}$ (8 V) |
| Unselected | $V_{INH}$ (4 V) | 0 V |

[FIG. 27A]
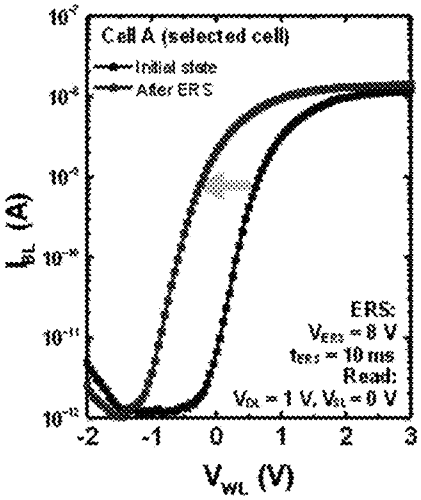
[FIG. 27B]
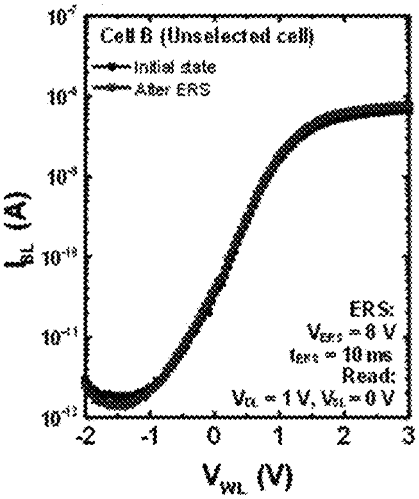

[FIG. 28A]
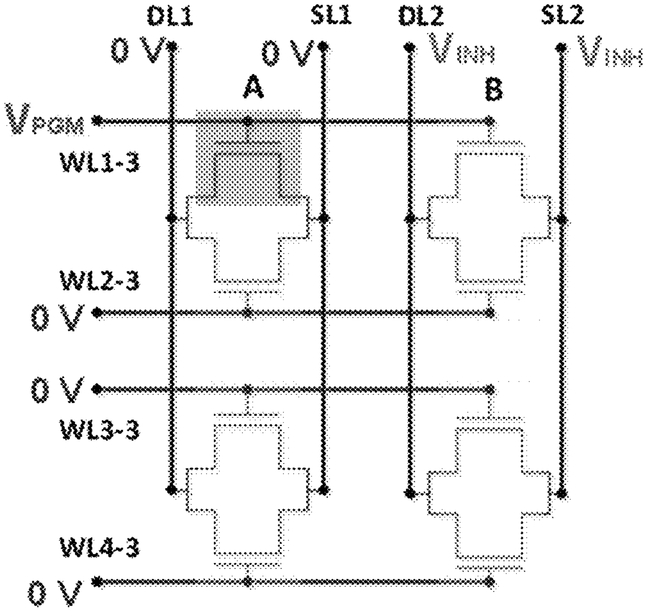
[FIG. 28B]
| FN Program | WL | DL & SL |
|---|---|---|
| Selected | $V_{PGM}$ (8 V) | 0 V |
| Unselected | 0 V | $V_{INH}$ (4 V) |

[FIG. 29A]
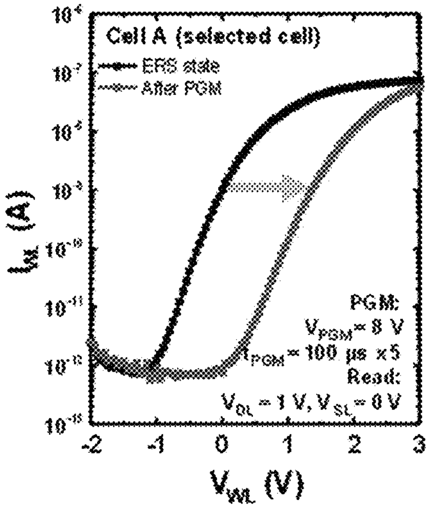
[FIG. 29B]
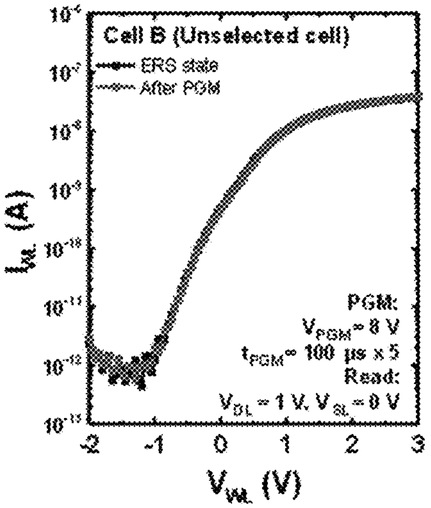

[FIG. 30A]
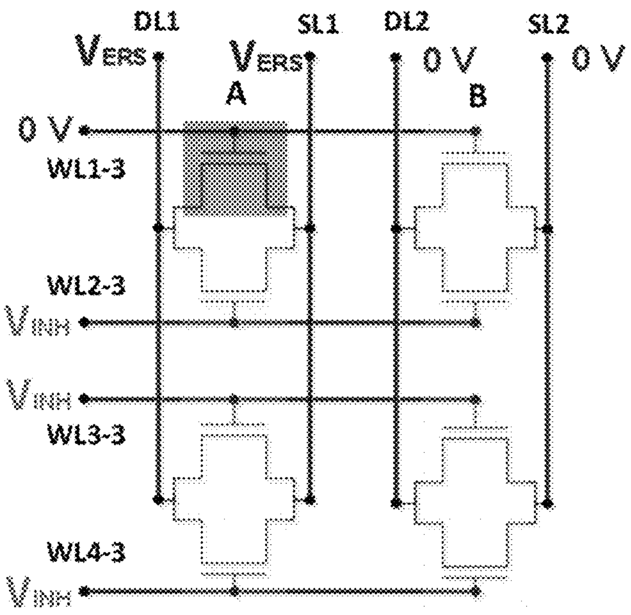
[FIG. 30B]
| GIDL Erase | WL | DL & SL |
|---|---|---|
| Selected | 0 V | $V_{ERS}$ (8 V) |
| Unselected | $V_{INH}$ (4 V) | 0 V |

[FIG. 31A]
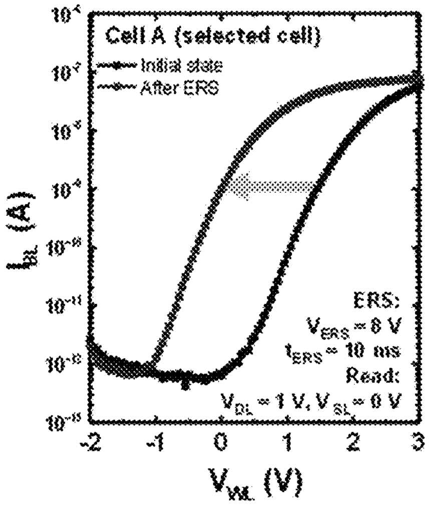
[FIG. 31B]
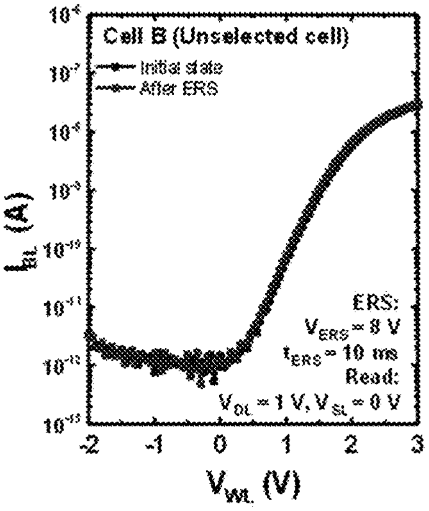

3D SYNAPSE DEVICE STACK, 3D STACKABLE SYNAPSE ARRAY USING THE 3D SYNAPSE DEVICE STACKS AND METHOD OF FABRICATING THE STACK

TECHNICAL FIELD

The present invention relates to a three-dimensional synapse device stack, a three-dimensional stackable synapse array using the same, and a method for manufacturing the three-dimensional synapse device stack, and more specifically, to a three-dimensional stackable synapse array capable of improving the degree of integration and improving operational reliability by implementing an AND-type synapse array or NOR-type synapse array in a three-dimensional stackable form using a three-dimensional synapse device stack and a method for manufacturing the same.

BACKGROUND ART

In recent years, many approaches have been made to imitate nervous systems of animals as power consumption has increased significantly and heat release problems have become more serious in integrated circuits based on the von Neumann architecture. Particularly, in the techniques imitating the nervous systems of animals, it is possible to improve the cognitive function and the determining function by enabling cognitive function and learning while greatly reducing power consumption. As a result, there is an opportunity to replace or greatly improve the functionality of the existing von Neumann integrated circuits. Therefore, much attention has been increasingly paid to the techniques, and the need for research has been greatly increased.

The basic function of neurons is to generate electrical spikes and transmit information to other cells in a case where a stimulus exceeds a threshold value. The resulting electrical signal is called an action potential. Neurons may be roughly divided into three portions. The neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or a stimulus receptor cell and transmits the stimulus to another nerve cell or a glandular cell. Exchanging the stimulus occurs at the synapse. One nerve cell (neuron) receives stimuli through a number of synapses and integrates the excitations, and after that, the nerve cell transmits an electrical spike to an axon near to the nerve cell body, so that the electrical spike reaches the synapse. In this manner, the transmission of the excitations from the neuron through the synapses to another nerve cell is referred to as excitation transmission. The excitation at the synapse is transmitted only from a nerve fiber toward a nerve cell body or a dendrite and is not transmitted in the reverse direction, so that the excitation is transmitted in only one direction as a whole. In addition, the synapses are not only relay sites that transmit the excitations but the synapses also cause weighting or inhibition according to temporal or spatial change in excitations reaching the synapses to enable higher level integration of the nervous system.

On the other hand, besides the synapses having the action of transmitting the excitation, there are synapses having the action of inhibiting the transmission of the excitations from other nerve cells. These synapses are called inhibitory synapses. When the excitation transmitted along some nerve fibers reaches the inhibitory synapse, the inhibitory transmitting material is secreted from the synapse. This inhibitory transmitting material acts on a cell membrane of the nerve cell connected to the synapse to inhibit the excitations of the cell from occurring (occurrence of an action potential). As a result, while the inhibitory transmitting material acts, the excitation reaching other synapses is not transmitted to the synapse.

Recently, various studies have been conducted to implement neural networks using RRAM devices (Xiaoyu Sun et al., "XNOR-RRAM: A Scalable and Parallel Resistive Synaptic Architecture for Binary Neural Networks", 2018 Design, Automation & Test in Europe Conference & Exhibition). However, in the case of Memristor-based synapses of the prior art, there is a disadvantage in that the reliability of the device is not good and the dispersion between the devices is large.

Also, recent attempts have been made to implement neural networks using SRAM devices (Si, X., et al., "A twin-8T SRAM computation-in-memory macro for multiple-bit CNN-based machine learning" In 2019 IEEE International Solid-State Circuits Conference-(ISSCC), pp. 396-398) However, implementing a neural network using an SRAM device according to the above-described prior art has good reliability, but has a disadvantage of low integration by using multiple devices.

Therefore, the present invention provides three-dimensional stackable synapse array architectures that can operate with low power and high reliability while increasing the degree of integration.

SUMMARY OF THE INVENTION

In order to solve the problems of the prior art described above, an object of the present invention is to provide a three-dimensional synapse device stack that can be implemented as an AND-type synapse array or a NOR-type synapse array, and has an excellent degree of integration and improved reliability.

Another object of the present invention is to a three-dimensional stackable synapse array using the three-dimensional synapse device stack.

Another object of the present invention is to provide a method for manufacturing the three-dimensional synapse device stack.

According to one aspect of the present invention, there is provided a three-dimensional synapse device stack, which comprises: a substrate having an oxide layer formed on its upper surface; a channel hole positioned on the substrate and formed in a pillar shape provided in the vertical direction of the substrate surface, the inside of which is filled with an insulating material; a semiconductor body positioned on the surface of the channel hole and comprising a semiconductor material provided on the surface of the channel hole; a plurality of first insulating layers positioned on an outer circumferential surface of the semiconductor body; a plurality of sources located on a first side surface of an outer circumferential surface of the semiconductor body; a plurality of drains positioned on a second side surface of an outer circumferential surface of the semiconductor body opposite to the first side surface; a plurality of word lines positioned on a third side surface of the outer peripheral surface of the semiconductor body positioned between the sources and the drains; a plurality of insulator stacks positioned between the word lines and the semiconductor body and including at least a layer for storing electric charges or causing polarization; a source line electrode positioned on a substrate, formed in a pillar shape provided in a vertical direction of the substrate surface, and electrically connected to the plurality of sources; and, a drain line electrode positioned on a substrate, formed in a pillar shape provided in a vertical direction of the substrate surface, and electrically connected to the plurality of drains;

wherein the first insulating layers and the sources are alternately stacked on the first side surface of the outer peripheral surface of the semiconductor body, and the first insulating layers and the drains are alternately stacked on the second side surface of the outer peripheral surface of the semiconductor body, and the first insulating layers and the word lines surrounded by the insulator stacks are alternately stacked on the third side surface of the outer circumferential surface of the semiconductor body, and the semiconductor body, the source, the drain, the insulator stack and the word line located on the same layer on the surface of the channel hole constitute a synapse device or a part thereof, and synapse devices electrically isolated from each other by the first insulating layers are stacked to form a stack structure.

In the three-dimensional synapse device stack according to the present invention, preferably the semiconductor body is located on the surface of the channel hole, but is not provided on the side surface of the first insulating layers positioned between the stacked word lines, so that adjacent word lines of the synapse devices stacked in a stack structure are electrically isolated from each other.

In the three-dimensional synapse device stack according to the present invention, preferably a region provided with synapse devices among the surface of the channel hole protrudes and extends toward the sources, drains, and word lines; and the semiconductor body is provided only on the surface of the protruding and extended channel hole, and is not provided on the non-protruding surface of the channel hole; so that adjacent word lines of synapse devices stacked in a stack structure are electrically isolated from each other.

In the three-dimensional synapse device stack according to the present invention, preferably a region where synapse devices are formed among the surface of the channel hole protrudes and extends toward the sources, drains, and word lines; and the semiconductor body is located on the surface of the channel hole, but is not provided on the side surfaces of the first insulating layers positioned between the stacked word lines; so that the word lines of the synapse devices stacked in a stack structure are electrically isolated from each other.

In the three-dimensional synapse device stack according to the present invention, preferably the insulator stack is composed of a single insulating layer or a stack structure in which a plurality of layers are stacked; and when configured in a stack structure, the insulator stack comprises at least a charge storage layer and an insulating layer, at least a ferroelectric layer and an insulating layer, at least a resistance change layer and an insulating layer, or at least a phase change layer and an insulating layer.

In the three-dimensional synapse device stack according to the present invention, preferably the three-dimensional synapse device stack further comprises a body landing pad positioned on the oxide layer, wherein the body landing pad is made of an electrically conductive material and is electrically connected to the semiconductor body.

In the three-dimensional synapse device stack according to the present invention, preferably the three-dimensional synapse device stack further comprises a source electrode landing pad and a drain electrode landing pad positioned on the oxide layer, wherein the source electrode landing pad is made of an electrically conductive material and is electrically connected to the source line electrode, and the drain electrode landing pad is made of an electrically conductive material and is electrically connected to the drain line electrode.

In the three-dimensional synapse device stack according to the present invention, preferably the three-dimensional synapse device stack further comprises an additional stack structure which shares the sources, the drains, the source line electrode and the drain line electrode and includes a plurality of additional word lines positioned on a fourth side of an outer circumferential surface of the semiconductor body opposite to the third side and alternately stacked with first insulating layers; and a plurality of additional insulator stack provided between the additional word lines and the semiconductor body, wherein the semiconductor body, the source, the drain, the additional insulator stack and the additional word line located on the same layer on the surface of the channel hole constitute an additional synapse device or a part thereof, and the synapse device and the additional synapse device located on the same laver share a source and a drain According to another aspect of the present invention, there is provided a three-dimensional stackable synapse array, characterized in that the three-dimensional synapse device stacks according to the present invention are arranged in an array form.

In the three-dimensional stackable synapse array according to the present invention, preferably the three-dimensional stacked synapse array constitutes an AND-type synapse array by arranging a source line electrode and a drain line electrode connecting the three-dimensional synapse device stacks side by side, or a NOR-type synapse array by arranging the source line electrode and the drain line electrode connecting the three-dimensional synapse device stacks to cross each other.

In the three-dimensional stackable synapse array according to the present invention, preferably the three-dimensional stackable synapse array further comprises a three-dimensional capacitor stack having the same structure as a three-dimensional synapse device stack.

In the three-dimensional stackable synapse array according to the present invention, preferably the three-dimensional stackable synapse array further comprises a CMOS integrated circuit used as a peripheral circuit under the substrate.

According to another aspect of the present invention, there is provided a method of manufacturing a three-dimensional synapse device stack comprising the following steps: (a) alternately depositing first insulating layers and second insulating layers on a substrate to form a stacked structure; (b) etching predetermined regions of the stacked structure using a photolithography process to form a first etch hole, a second etch hole, a third etch hole, and a trench for stack isolation, and to the etched regions of the stacked structure depositing a passivation material and planarizing the surface; (c) selectively etching the passivation material filled in the first etch hole to form a channel hole, forming a semiconductor body made of a semiconductor material to be used as a channel on the surface of the channel hole, and filling the inside of the channel hole with oxide material and planarizing the surface; (d) selectively etching the passivation material of the second etch hole and the third etch hole, and selectively etching the second insulating layer from the surfaces of the second etch hole and the third etch hole to be recessed, and depositing a highly doped semiconductor material in the recessed spaces and the second and third etch holes to form a plurality of sources, a plurality of drains, a source line electrode connected to the sources, and a drain line electrode connected to the drains; and (e) selectively etching the passivation material of the trench for stack isolation, selectively etching the second insulating layers from the surface of the trench for stack isolation to be recessed, and depositing insulator stacks on the surface of the recessed spaces, depositing conductive material and then etching to form a plurality of word lines separated for each layer.

In the method of manufacturing a three-dimensional synapse device stack according to the present invention, preferably the step (e) is performed by: selectively etching the passivation material of the trench for stack isolation, selectively etching the first insulating layers until the semiconductor body is exposed, etching the exposed semiconductor body, and filling the etched regions with oxide material again; and then selectively etching the second insulating layers from the surface of the trench for stack isolation to be recessed, depositing the insulator stacks on the surface of the recessed spaces, depositing the conductive material and then etching to form a plurality of word lines separated for each layer.

In the method of manufacturing a three-dimensional synapse device stack according to the present invention, preferably the step (c) is performed by: etching the passivation material filled in the first etch hole to form the channel hole, selectively etching the second insulating layers from the surface of the channel hole to be recessed, and forming the semiconductor body made of a semiconductor material on the surface of the recessed spaces; and then depositing oxide material in the recessed regions and the channel hole, removing the remaining oxide material except for the oxide material filled in the recessed regions, and selectively removing the semiconductor material exposed due to removing the oxide material.

In the method of manufacturing a three-dimensional synapse device stack according to the present invention, preferably the first insulating layer and the second insulating layer are made of materials having different etch ratios.

The 3D synapse device stack according to the present invention having the above-described structure and the 3D stackable synapse array using the same implement the synapse devices in a three-dimensional stacked type, thereby significantly improving the degree of integration.

In addition, according to the present invention, by adjusting the voltages applied to each electrode, selective programing and selective erasing operations are possible for each layer and each position with respect to the synapse devices constituting the 3D stackable synapse array. As a result, the 3D stackable synapse array according to the present invention not only improves performance, but also improves reliability.

The 3D stackable synapse array according to the present invention having the above-described structure can be implemented as a capacitor using the insulator stack of each synapse device, and as a result, a capacitor stack structure can be provided by using the structure of the 3D synapse device stack as it is.

In addition, the 3D stackable synapse array according to the present invention having the above-described structure provides a source electrode and a drain electrode landing pads on a substrate, so that a CMOS circuit can be easily integrated and connected to the lower portion of the 3D synapse device stack.

BRIEF DESCRIPTION OF THE DRAWINGS

FIG. 3A is a cross-sectional view of the first direction of FIG. 2; and FIG. 3B is a cross-sectional view of the second direction of FIG. 2.

FIGS. 6A and 6B are cross-sectional views in first and second directions illustrating another embodiment of a semiconductor body in a three-dimensional synapse device stack according to a preferred embodiment of the present invention.

FIGS. 8A and 8B are cross-sectional views in first and second directions illustrating another embodiment of a channel hole and a semiconductor body in a three-dimensional synapse device stack according to a preferred embodiment of the present invention.

FIGS. 10A and 10B are cross-sectional views in first and second directions illustrating another embodiment of a channel hole and a semiconductor body in a three-dimensional synapse device stack according to a preferred embodiment of the present invention.

FIGS. 12A and 12B are cross-sectional views in first and second directions illustrating another embodiment of a channel hole in a three-dimensional synapse device stack according to a preferred embodiment of the present invention.

FIGS. 13A and 13B are cross-sectional views in first and second directions showing body landing pad, source and drain electrode landing pads in a three-dimensional synapse device stack according to a preferred embodiment of the present invention.

FIGS. 14A and 14B are cross-sectional views in first and second directions showing body landing pad, source and drain electrode landing pads in a structure having a channel hole of FIG. 12 in a three-dimensional synapse device stack according to a preferred embodiment of the present invention.

FIGS. 15A and 15B are cross-sectional views illustrating other embodiments of first and second word lines in a three-dimensional synapse device stack according to a preferred embodiment of the present invention.

FIGS. 16A and 16B are schematic diagrams illustrating an AND-type synapse array architecture and a NOR-type synapse array architecture constructed using three-dimensional stackable synapse arrays using a three-dimensional synaptic stack according to the present invention.

FIGS. 17A and 17B are a cross-sectional view and an equivalent circuit diagram illustrating an example of an AND-type synapse array structure in a three-dimensional stackable synapse array according to the present invention.

FIGS. 18A and 18B are a cross-sectional view and an equivalent circuit diagram illustrating an example of a compact AND-type synapse array structure in a three-dimensional stackable synapse array according to the present invention.

FIGS. 19A and 19B are a cross-sectional view and equivalent circuit diagram illustrating an example of a structure of a NOR-type synapse array in a three-dimensional stackable synapse array according to the present invention.

FIGS. 20A and 20B are a cross-sectional view and an equivalent circuit diagram illustrating an example of a compact NOR-type synapse array structure in a three-dimensional stackable synapse array according to the present invention.

FIG. 21A is a schematic diagram illustrating an example of an AND-type synapse array structure in a three-dimensional stackable synapse array according to the present invention; and FIG. 21B is a schematic diagram illustrating an example of a NOR-type synapse array structure as a whole.

FIGS. 24A and 24B are an equivalent circuit diagram and a table showing voltages applied to each terminal for explaining a selective program operation among individual layer operating methods in the three-dimensional stackable AND synapse array structure shown in FIG. 23.

FIGS. 25A and 25B are graphs of the read results for the synapse device (CELL A) that has performed a program operation according to the selective program operation according to FIG. 24 and the synapse device (CELL B) that does not have the program operation.

FIGS. 26A and 26B are an equivalent circuit diagram and a table showing voltages applied to each terminal for explaining a selective erase operation among individual layer operating methods in the three-dimensional stacked AND synapse array structure shown in FIG. 23.

FIGS. 27A and 27B are graphs of read results for the synapse device CELL A that has performed an erase operation according to the selective Erase operation shown in FIG. 26 and the synapse device CELL B that has not performed the erase operation.

FIGS. 28A and 28B are an equivalent circuit diagram and a table showing voltages applied to each terminal for explaining a selective program operation among operating methods according to positions in the three-dimensional stackable AND synapse array structure shown in FIG. 23.

FIGS. 29A and 29B are graphs representing results of a read operation for the synapse device (CELL A) that has performed a program operation according to the selective program operation according to FIG. 28 and the synapse device (CELL B) that does not perform the program operation.

FIGS. 30A and 30B are an equivalent circuit diagram and a table showing voltages applied to each terminal for explaining a selective erase operation among operating methods according to a position in the three-dimensional stackable AND synapse array structure shown in FIG. 23.

FIGS. 31A and 31B are graphs representing results of a read operation for the synapse device CELL A that has performed an erase operation according to the selective erase operation of FIG. 30 and the synapse device CELL B that has not performed the erase operation.

DETAILED DESCRIPTION

Hereinafter, a three-dimensional synapse device stack made of three-dimensional stackable synapse devices according to the present invention, a three-dimensional synapse array using the three-dimensional synapse device stack, and a manufacturing method thereof will be described in detail with reference to the accompanying drawings.

<3D Synapse Device Stack>

Figure 1:
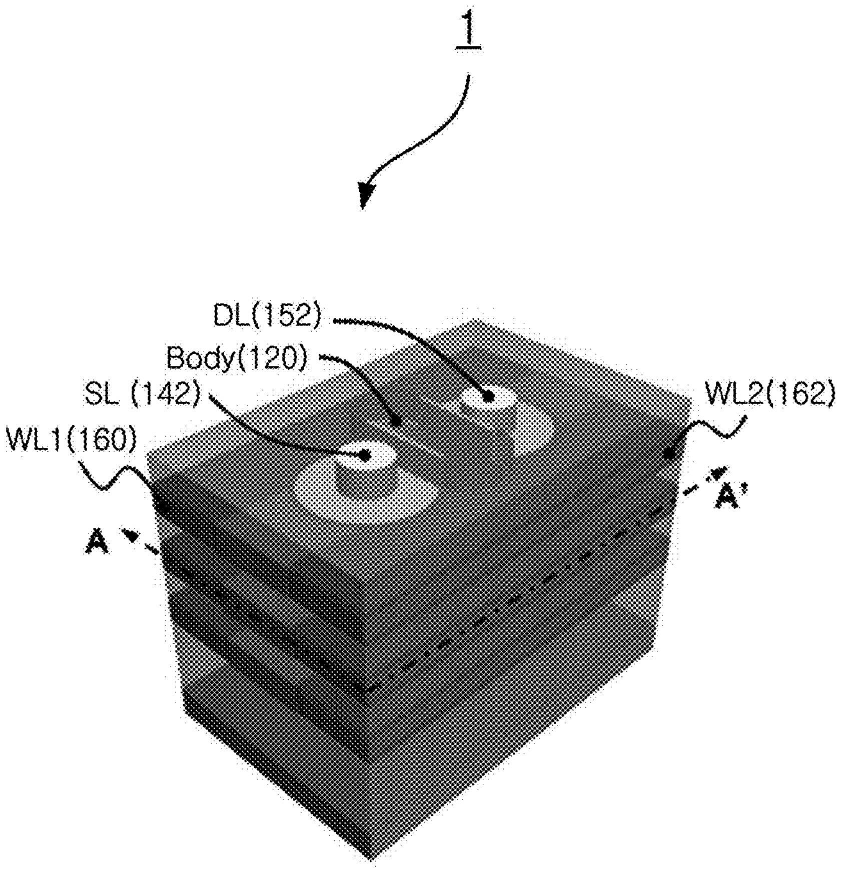
FIG. 1 is a perspective view showing a three-dimensional synapse device stack according to a preferred embodiment of the present invention.
Figure 2:
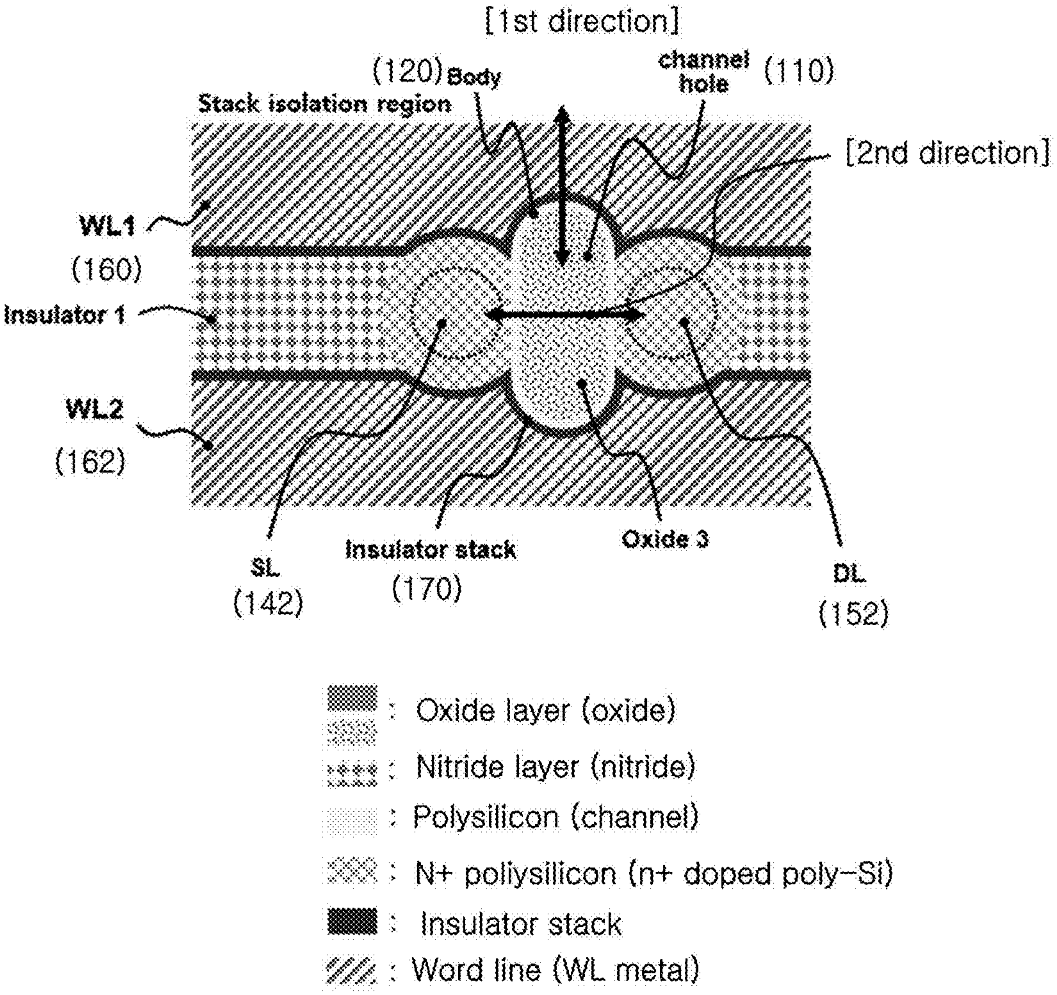
FIG. 2 is a cross-sectional view along the A-A' direction of FIG. 1.

FIG. 1 is a perspective view showing a three-dimensional synapse device stack according to a preferred embodiment of the present invention; FIG. 2 is a cross-sectional view along the A-A' direction of FIG. 1; FIG. 3A is a cross-sectional view of the first direction of FIG. 2; and FIG. 3B is a cross-sectional view taken in the second direction of FIG. 2.

Hereinafter, with reference to FIGS. 1 to 3, the structure and operation of a three-dimensional synapse device stack according to a preferred embodiment of the present invention will be described in detail. For convenience, in the present specification, a three-dimensional synapse device stack is described assuming that the synapse device has a stacked structure of three layers. However, the three-dimensional synapse device stack according to the present invention is not limited to the three-layer stacked structure of the synapse device, and may be manufactured as a stacked structure consisting of a plurality of more layers if necessary.

Referring to FIGS. 1 to 3, the three-dimensional synapse device stack 1 according to a preferred embodiment of the present invention includes a substrate (not shown), a channel hole 110, a semiconductor body 120, a plurality of first insulating layers 130, a plurality of sources 140, a plurality of drains 150, a source line electrode 142, a drain line electrode 152, a plurality of word lines 160, and a plurality of insulator stacks 170. The semiconductor body, the source, the drain, the insulator stack, and the word line positioned on the same layer on the side of the channel hole constitute a synapse device or a part thereof. Each synapse device is electrically isolated by the first insulating layers. A plurality of synapse devices electrically isolated from each other by the first insulating layers are vertically stacked on a side surface of a channel hole to constitute a single stack structure.

In addition, the three-dimensional synapse device stack according to the present invention can further improve the degree of integration by further including an additional stack structure having the same structure on the side of the channel hole. The additional stack structure has additional word lines and additional insulator stacks and is configured to share sources, drains, a source line electrode and a drain line electrode of the stack structure.

The three-dimensional synapse device stack of the above-described structure is electrically isolated from the adjacent three-dimensional synapse device stack by further comprising a fourth oxide layer 132 on the side surface of the word lines.

Hereinafter, each of the above-described components will be described in detail.

The substrate includes a first oxide layer (Oxide 1) 100 on the surface, and the three-dimensional synapse device stack according to the present invention is provided along a vertical direction on the first oxide layer 100 of the substrate.

The channel hole 110 is located on the surface of the substrate, and is formed of a hole provided in a pillar shape along a direction perpendicular to the surface of the substrate. The inside of the channel hole is filled with an oxide material having electrical insulation to form a third oxide layer (Oxide 3).

The semiconductor body (Body) 120 is positioned on the side surface of the channel hole, and is formed by applying a semiconductor material to the surface of the channel hole in the form of a thin layer. The semiconductor body may be made of a semiconductor material such as polysilicon, poly SiGe, metal oxide, or the like. The semiconductor body 120 having the above-described structure is configured to form a channel during device operation.

The plurality of first insulating layers (Oxide 2) 130 are positioned on the outer circumferential surface of the semiconductor body, and are stacked to be spaced apart from each other in a vertical direction of the outer circumferential surface of the semiconductor body. The first insulating layer may be formed of, for example, an oxide layer (Oxide 2). The first insulating layers are disposed between the stackable synapse devices to electrically isolate the stackable synapse devices from each other on the side of the channel hole. The plurality of sources 140 are positioned on a first side surface of the outer circumferential surface of the semiconductor body, and are alternately stacked with first insulating layers positioned on the first side surface. The plurality of drains 150 are disposed on a second side surface of an outer circumferential surface of the semiconductor body opposite to the first side surface in a second direction, and are alternately stacked with the first insulating layers disposed on the second side surface.

The word lines (WL1) 160 are respectively positioned on a third side of the outer peripheral surface of the semiconductor body positioned between the source (S) and the drain (D), and alternately stacked with the first insulating layers. The insulator stacks 170 are provided between at least the word lines and the semiconductor body, and may be further provided between the word lines and the first insulating layer. Here, the word lines (WL1) 160 located on the third side and the word lines (WL2) 162 located on the fourth side form different stack structures. The word lines (WL2) 162 are respectively positioned on a fourth side of the outer peripheral surface of the semiconductor body positioned between the source (S) and the drain (D), and alternately stacked with the first insulating layers.

As shown in FIGS. 2 and 3, the word lines surrounded by the insulator stack are alternately stacked with the first insulating layers on third and fourth side surfaces of the outer circumferential surface of the semiconductor body along the first direction. The sources and the drains are alternately stacked with the first insulating layers on the first and second side surfaces of the outer circumferential surface of the semiconductor body along the second direction. In this case, the semiconductor bodies in the first direction and the second direction are connected to each other, and word lines surrounded by the insulator stack are positioned between the source and the drain.

The source line electrode (SL) 142 is spaced apart from the first side surface of the outer circumferential surface of the semiconductor body by a predetermined distance, and has a pillar shape provided along a vertical direction on the substrate. A side surface of the source line electrode is electrically connected to contact with the plurality of sources. The drain line electrode (DL) 152 is spaced apart from the second side surface of the outer circumferential surface of the semiconductor body by a predetermined distance, and has a pillar shape provided along a vertical direction on the substrate. A side surface of the drain line electrode is electrically connected to contact with the plurality of drains.

The word lines (WL1, WL2) 160 and 162 are respectively positioned on third and fourth opposite sides of the outer circumferential surface of the semiconductor body positioned between the source and the drain, and are alternately stacked with the first insulating layers.

The insulator stacks 170 are provided between at least the word lines and the semiconductor body, and may be further provided between the word lines and the first insulating layers. The insulator stack may be composed of a single layer or a stack structure in which at least two or more layers are stacked, and the insulator stack includes a layer that stores electric charges or causes polarization.

When the insulator stack is formed of a single layer, it may be formed of an oxide layer, a nitride layer, or the like. And, when the insulator stack is configured in a stack structure, it may include at least a charge storage layer and an insulating layer, a ferroelectric layer and an insulating layer, a resistance change layer and an insulating layer, or a phase change layer and an insulating layer.

The insulator stack preferably has a stack structure in which a plurality of lavers including at least a charge storage layer and an insulating layer are stacked, and the structure of the insulator stack may be implemented in various embodiments. On the other hand, when the insulator stack includes a charge storage layer and an insulating layer, preferably the insulating layer is not disposed between the semiconductor body and the charge storage layer, or an insulating layer is disposed with a thickness of 4 nm or less even if disposed, so that the operating voltage of program or erase can be lowered.

In addition, the insulator stack may be configured by stacking a plurality of insulating layers. In this case, at least one of the plurality of insulating layers constituting the insulator stack includes an insulating layer having a trap for enabling charge storage, and the insulating layer operates as a charge storage layer, so that the device can implement a memory function which stores information in a non-volatile form. For example, the insulator stack may have a stacked structure of a first insulating layer, a charge storage layer, and a second insulating layer, or a stacked structure of an insulating layer and a charge storage layer. Here, the insulating layer of the insulator stack may use silicon oxide, aluminum oxide, or the like, and the charge storage layer may use silicon nitride, hafnium oxide, or the like.

In addition, at least one of the plurality of insulating layers constituting the insulator stack may implement a memory function for storing information in a non-volatile form using a polarization-inducing material. For example, the insulator stack may be provided in a stacked structure of a material layer causing polarization and an insulating layer. Here, the insulating layer of the insulator stack may use silicon oxide, aluminum oxide, or the like, and a plurality of materials including hafnium oxide (HfZrOx) may be used as the polarization-inducing material.

By the structure having the above-described configuration, the semiconductor body, the source, the drain, the insulator stack and the word line positioned on the same layer on the side of the channel hole constitute a synapse device or a part thereof. In addition, the synapse devices formed in each layer are electrically isolated from each other by the first insulating layers and stacked, thereby constituting a stack structure as a whole.

In addition, the additional insulator stack and the additional word line provided on the same layer on the side of the channel hole share a semiconductor body, a source, a drain, a source line electrode and a drain line electrode to constitute an additional synapse device or a part thereof. In addition, the additional synapse devices formed in each layer are electrically isolated from each other by the first insulating layers and stacked, thereby constituting an additional stack structure as a whole.

Accordingly, two synapse devices sharing the device and drain may be formed on the same layer on the side surfaces of the channel hole, and two synapse device stacks separated from each other are provided on the side surfaces of the channel hole. The present invention can provide a basic synapse device structure that can be effectively implemented in a three-dimensional stack structure, and the degree of integration and the performance of the device can be improved by the above-described structure. The three-dimensional synapse device stack having the above-described structure can be applied to various array architectures, and preferably can be applied to AND-type Synapse Array Architecture or NOR-type Synapse Array Architecture.

Hereinafter, with reference to the accompanying drawings, a method for manufacturing a three-dimensional stackable synapse array according to a preferred embodiment of the present invention will be described in detail.

Figure 4:
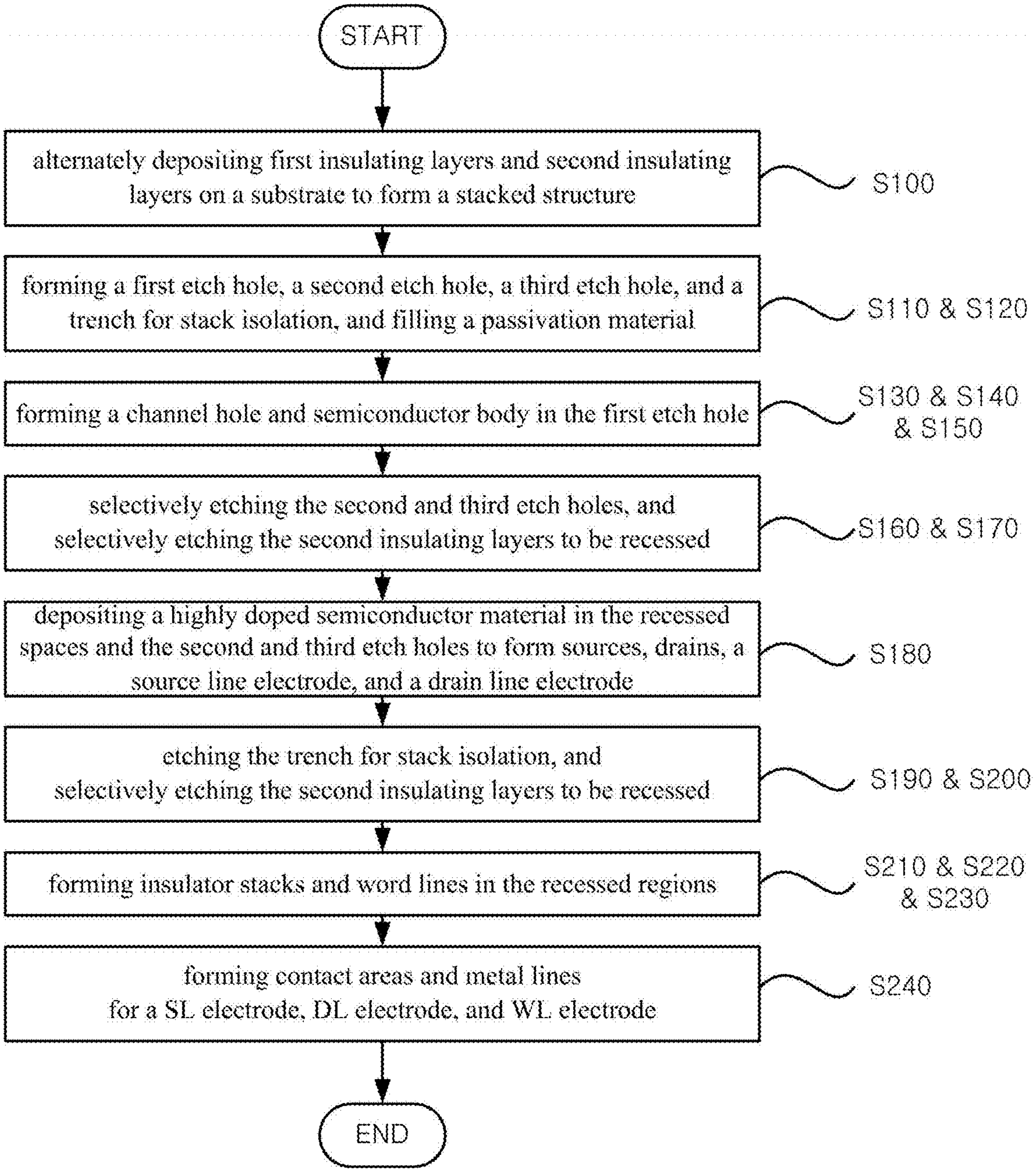
FIG. 4 is a flowchart sequentially illustrating a method of manufacturing a three-dimensional synapse device stack according to a preferred embodiment of the present invention.
Figure 5A:
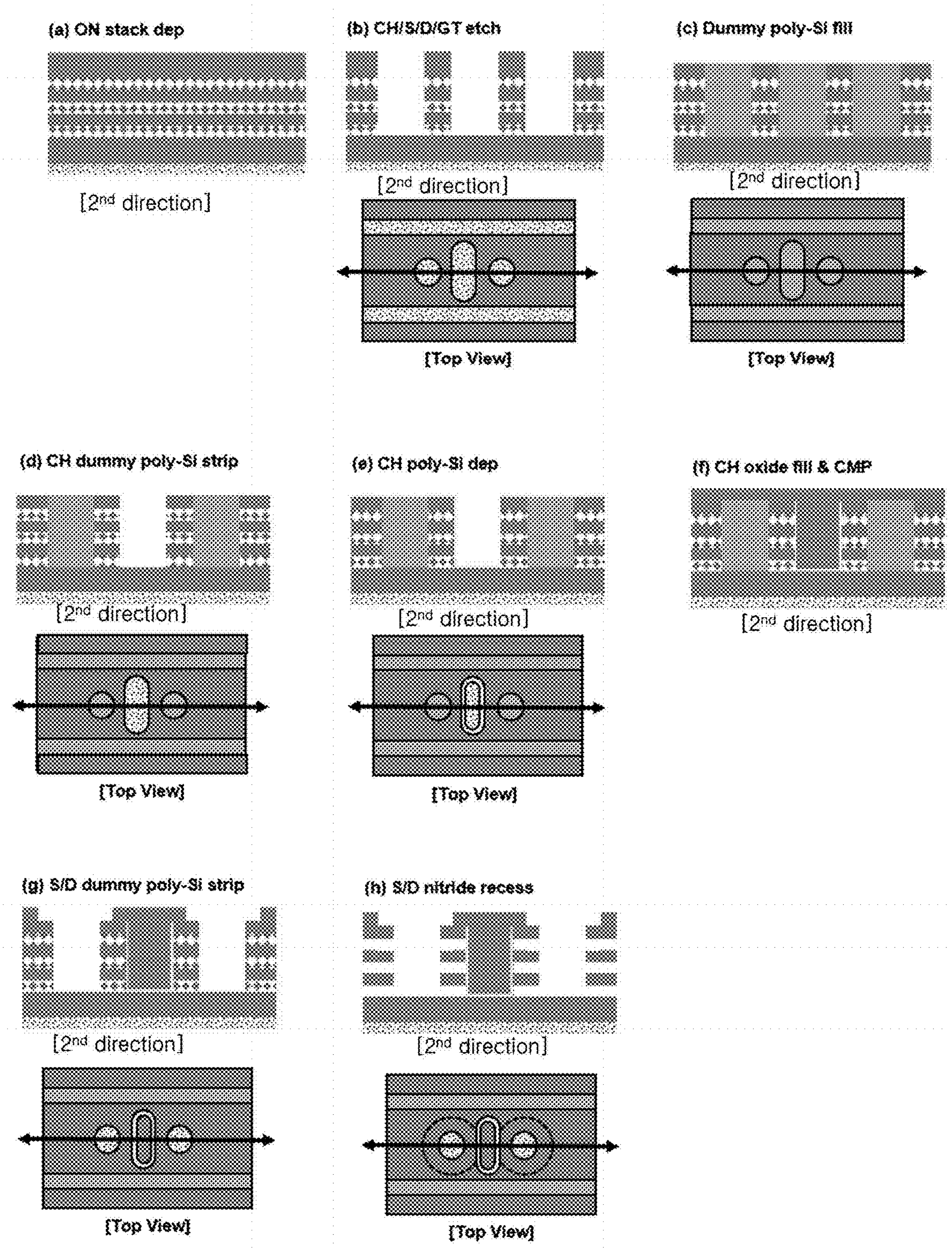
FIGS. 5A and 5B are cross-sectional views and top views showing the results of each step of the method for manufacturing a three-dimensional stackable synapse device stack according to a preferred embodiment of the present invention.
Figure 5B:
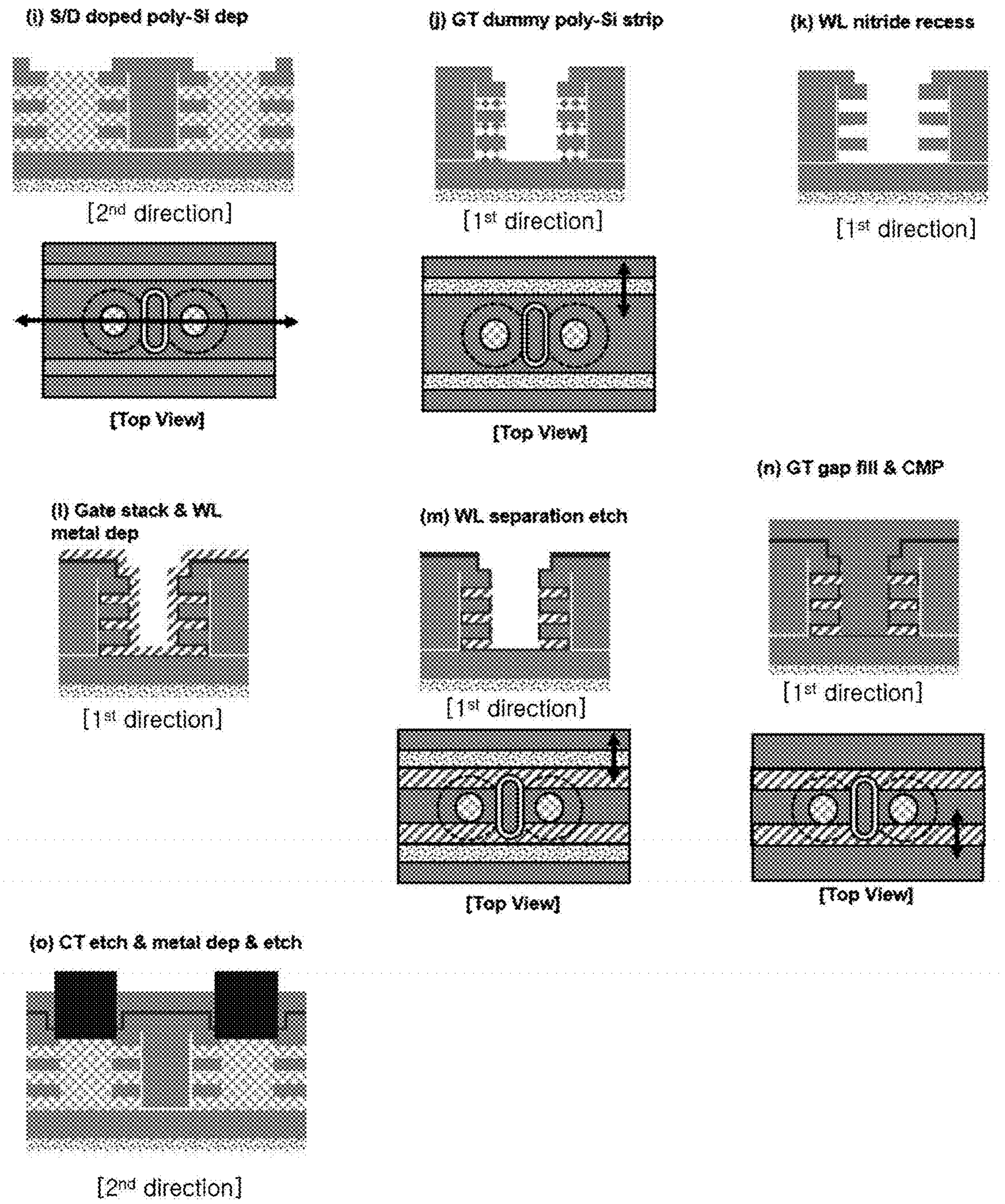

FIG. 4 is a flowchart sequentially illustrating a method of manufacturing a three-dimensional synapse device stack according to a preferred embodiment of the present invention; and FIGS. 5A and 5B are cross-sectional views and top views showing the results of each step of the method for manufacturing a three-dimensional stackable synapse device stack according to a preferred embodiment of the present invention.

Referring to FIGS. 4 and 5A and 5B, first, first insulating layers and second insulating layers are alternately deposited on a substrate to form a finished stacked structure (step 100, (a) of FIG. 5A). Preferably, the first insulating layers and the second insulating layers are made of materials having different etch ratios, so that while the first insulating layers are etched, the second insulating layers are hardly etched, and while the second insulating layers are etched, the first insulating layers are hardly etched. Here, the first insulating layers may be, for example, an oxide layer (Oxide 2), and the second insulating layers may be a nitride layer (Nitride).

Predetermined regions of the stacked structure are etched using a photolithography process to simultaneously form a first etch hole, a second etch hole, a third etch hole, and a trench for stack isolation (step 110, (b) of FIG. 5A). Next, after depositing a passivation material on the etched regions of the stack structure, the surface is planarized (step 120, (c) of FIG. 5A). Here, as the passivation material, polysilicon for passivation may be used.

Next, the passivation material filled in the first etch hole is etched to expose the surface of the first etch hole, thereby forming a channel hole (step 130, (d) of FIG. 5A). Next, after forming a semiconductor body made of a semiconductor material to be used as a channel on the surface of the channel hole (step 140, (e) of FIG. 5A), the inside of the channel hole is filled with an oxide material and then planarized (step 150, (f) of FIG. 5A).

Next, the passivation material of the second etch hole and the third etch hole are etched to expose the surfaces of the second etch hole and the third etch hole (step 160, (g) of FIG. 5A). Next, the second insulating layers are selectively etched from the exposed surfaces of the second etch hole and the third etch hole to be recessed (step 170, (h) of FIG. 5A). Next, a semiconductor material heavily doped with N+ is deposited in the recessed spaces and the exposed second and third etch holes, so that a plurality of sources, a source line electrode connected to the sources, a plurality of drains, and a drain line electrode connected to the drains are formed (step 180, (i) of FIG. 5B).

Next, the passivation material of the trench for stack isolation is etched to expose the surface of the trench for stack isolation (step 190, ( ) of FIG. 5B). Next, a second insulating layers are selectively etched from the exposed surface of the trench for stack isolation to be recessed (step 200, (k) of FIG. 5B). Next, insulator stacks are deposited on the surface of the recessed spaces and a conductive material to be word lines is deposited (step 210, (l) of FIG. 5B). Next, the conductive material is isotropically etched to form a plurality of word lines separated by layers (step 220, (m) of FIG. 5B). Here, as the conductive material, a metal having electrical conductivity, a semiconductor material highly doped with impurities, or the like may be used. Next, the inside of the trench for stack isolation in which the word lines are formed is filled with an oxide material and then planarized the surface (step 230, (n) of FIG. 5B).

Next, regions for forming wirings of the source line electrode, drain line electrode, and word line electrode are etched, a metal material is deposited on the etched areas, and then the metal material is etched using a photolithography process to form the contact regions of the source line electrode, the drain line electrode and the word line electrode (step 240, (o) of FIG. 5B).

Through the above-described manufacturing process, the three-dimensional synaptic device stack according to the embodiment shown in FIGS. 1 to 3 is completed.

Hereinafter, the structure and manufacturing method of various embodiments of three-dimensional synapse device stacks according to a preferred embodiment of the present invention will be described.

FIGS. 6A and 6B are cross-sectional views in first and second directions illustrating another embodiment of a semiconductor body in a three-dimensional synapse device stack according to a preferred embodiment of the present invention.

Referring to FIGS. 6A and 6B, a semiconductor body is not provided on a side surface of the first insulating layers positioned between the stacked word lines. As described above, since the semiconductor body is provided only on the side surfaces of the word lines and the semiconductor body is not provided on the side surface of the first insulating lavers positioned between the word lines, the word lines adjacent to each other in the vertical direction are electrically isolated from each other.

The manufacturing method of the three-dimensional synapse device stack according to this embodiment is basically the same as the process described in FIGS. 4, 5A and 5B, except that after the step of etching the passivation material of the trench for stack isolation (step 190), the following additional processes are further provided.

Figure 7:
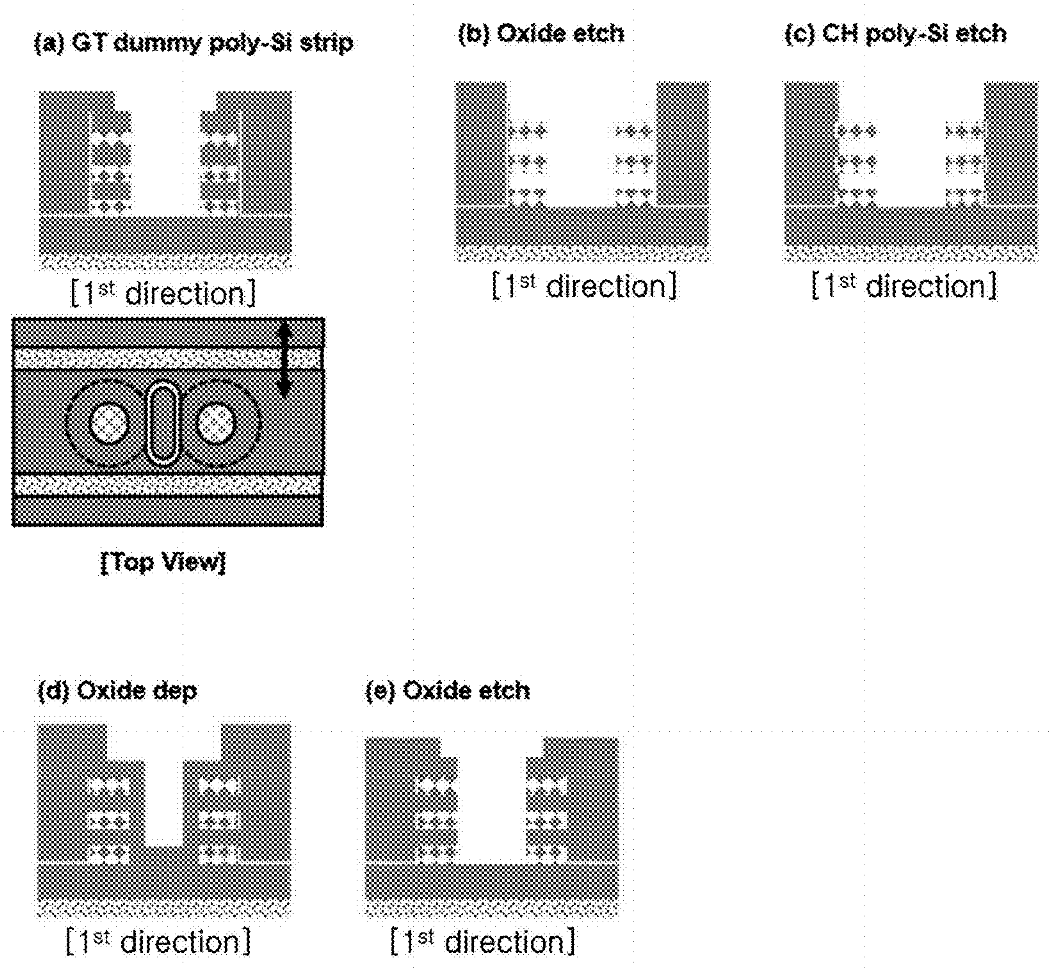
FIG. 7 are cross-sectional views and a top view showing the results of some steps in the manufacturing method of the three-dimensional synapse device stack of the present invention shown in FIGS. 6A and 6B.

FIG. 7 is cross-sectional views and a top view showing the results of some steps in the manufacturing method of the three-dimensional synapse device stack of the present invention shown in FIGS. 6A and 6B.

Referring to FIG. 7, in the manufacturing method of the stack according to the present embodiment, after etching the passivation material of the trench for stack isolation ((a) of FIG. 7), the first insulating layer of the stacked structure is selectively etched until the channel (ie, the semiconductor body) is exposed (step 192, (b) of FIG. 7). Next, the exposed channel (ie, the semiconductor body) is etched (step 193, (c) of FIG. 7), and the etched regions are again filled with an oxide material (step 194, (d) & (e) of FIG. 7). In this way, by further providing the above-described steps 190 to 194, a three-dimensional synapse device stack having a channel only on the side of the word lines is manufactured.

FIGS. 8A and 8B are cross-sectional views in first and second directions illustrating another embodiment of a channel hole and a semiconductor body in a three-dimensional synapse device stack according to a preferred embodiment of the present invention.

Referring to FIGS. 8A and 8B, region in which synapse device are formed among the side surfaces of the channel hole protrudes toward the source, drain, and word line and extends. In addition, the semiconductor body is provided only on the surface of the protruding region of the surface of the channel hole and is not provided on the surface of the non-protruding region of the surface of the channel hole. Accordingly, the semiconductor body is not provided on the first side surface of the first insulating layers positioned between the stackable synapse devices. In this way, since the semiconductor body is provided on the surface of the word lines and the surface of the sources and drains, and the semiconductor body is not provided on the surface of the first insulating layers in contact with the channel hole, each synapse device is electrically isolated from the synapse devices of the adjacent layer by the first insulating layers, and as a result, the performance of the device is improved.

The manufacturing method of the three-dimensional synapse device stack according to this embodiment is basically the same as the process described in FIGS. 4, 5A and 5B, except that after the step of etching the passivation material filled in the first etch hole (step 130), the following additional processes are further provided.

Figure 9:
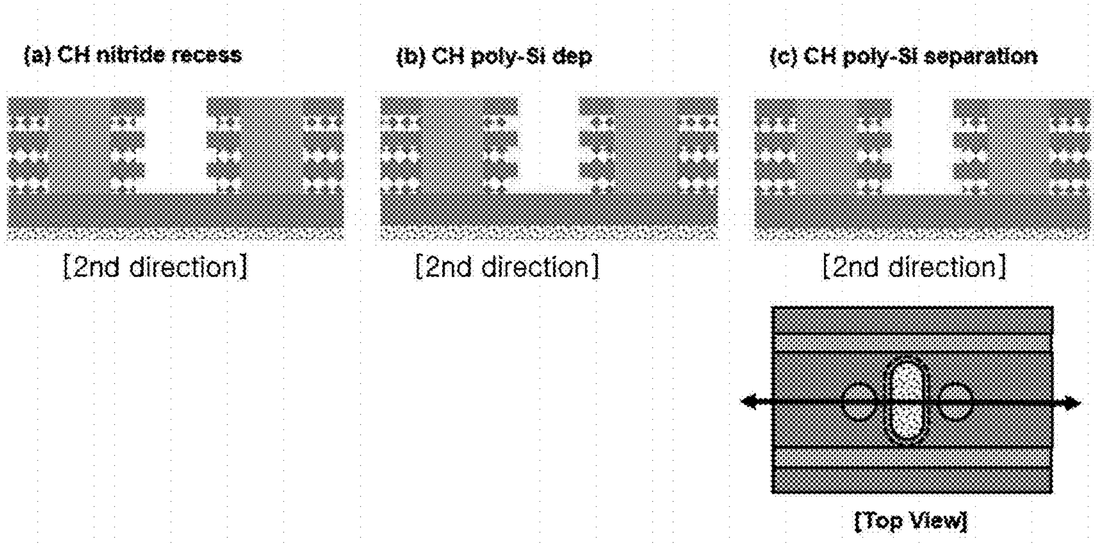
FIG. 9 is cross-sectional views and a top view showing the results of some steps in the manufacturing method of the three-dimensional synapse device stack of the present invention shown in FIGS. 8A and 8B.

FIG. 9 is cross-sectional views and a top view showing the results of some steps in the manufacturing method of the three-dimensional synapse device stack of the present invention shown in FIGS. 8A and 8B.

Referring to FIG. 9, in the method of manufacturing a stack according to the present embodiment, after etching the passivation material of the first etch hole, second insulating layers are selectively partially etched from the surface of the first etch hole to be recessed (step 132, (a) of FIG. 9), a semiconductor body made of a semiconductor material is formed on the surface of the first etch hole (step 134, (b) of FIG. 9), and the semiconductor material is anisotropically etched (Dry Etching) (step 136, (c) of FIG. 9).

In this way, by further providing the above-described steps 132 to 136, a three-dimensional synapse device stack is manufactured in which the semiconductor body is provided on the surface of the protruding region of the channel hole and the semiconductor body is not provided on the surface of the first insulating layers.

FIGS. 10A and 10B are cross-sectional views in first and second directions illustrating another embodiment of a channel hole and a semiconductor body in a three-dimensional synapse device stack according to a preferred embodiment of the present invention.

Referring to FIGS. 10A and 10B, a region in which synapse devices are formed among the surface of the channel hole protrudes toward the sources, drains, and word lines and extends. The semiconductor body is provided on the surface of the protruding region of the surface of the channel hole and on the surface of the first insulating layers positioned between the sources and the drains, but is not provided on the surface of the first insulating layers positioned between the word lines stacked in the vertical direction.

As described above, since the semiconductor body is not provided on the surface of the first insulating layers positioned between the word lines, the word lines are electrically isolated from the word lines of the vertically adjacent layer by the first insulating layers and, as a result, the device performance will be improved.

Figure 11:
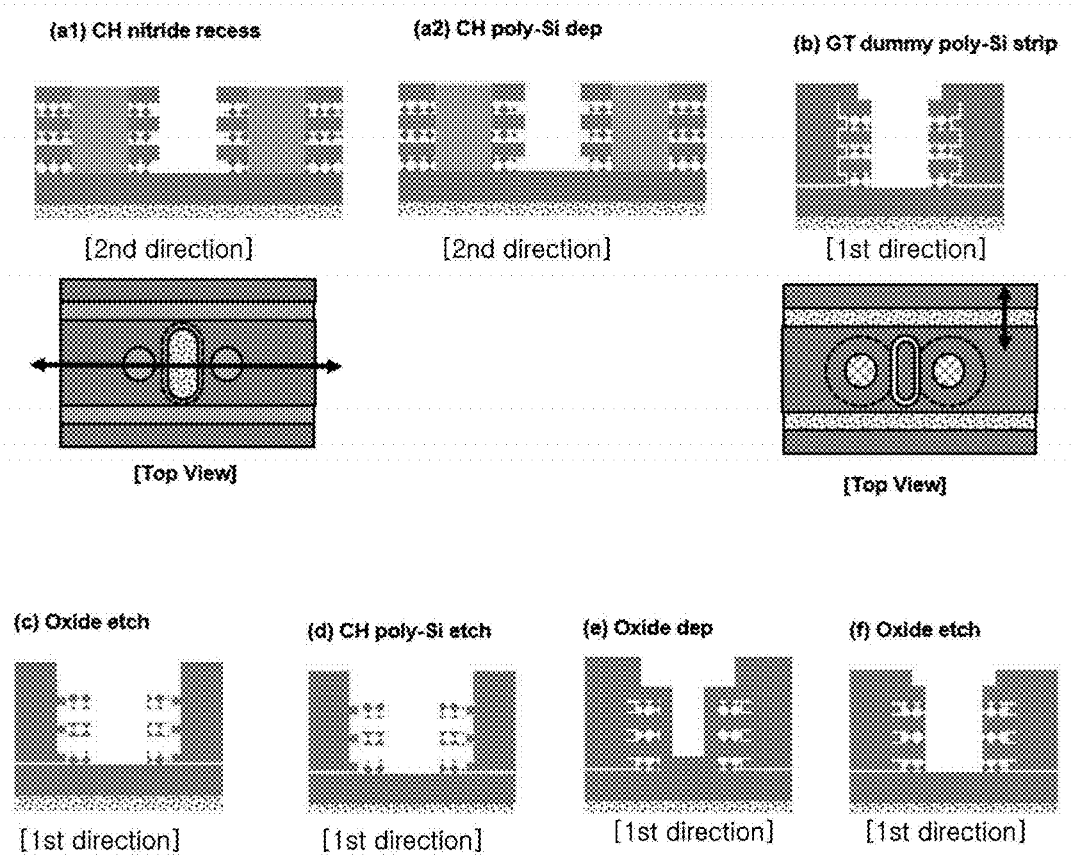
FIG. 11 is cross-sectional views and top views showing the results of some steps in the manufacturing method of the three-dimensional synapse device stack of the present invention shown in FIGS. 10A and 10B.

FIG. 11 is cross-sectional views and top views showing the results of some steps in the manufacturing method of the three-dimensional synapse device stack of the present invention shown in FIGS. 10A and 10B.

The manufacturing method of the three-dimensional synapse device stack according to the present embodiment is basically the same as the process described in FIGS. 4, 5A and 5B, except that after the step of etching the passivation material filled in the first etch hole (step 130), steps 132 to 134, which are processes to be described later, are further provided, and after the step of etching the passivation material of the trench for stack isolation (step 190), steps 192 to 194 are further provided.

FIG. 11 is cross-sectional views and top views showing the results of some steps in the manufacturing method of the three-dimensional synapse device stack of the present invention shown in FIGS. 10A and 10B.

Referring to (a1) and (a2) of FIG. 11, in the method for manufacturing a three-dimensional synapse device stack according to the present embodiment, the passivation material filled in the first etch hole is etched, the second insulating layers are selectively partial etched from the exposed surface of the first etch hole to be recessed (step 132, (a1) of FIG. 11), and a semiconductor body made of a semiconductor material is formed on the surface of the first etch hole (step 134, (a2) of FIG. 11). In this way, by further providing the above-described steps 132 to 134, the surface of the channel hole in which the device is to be formed protrudes.

And, referring to (b) of FIG. 11), in the manufacturing method of the three-dimensional synapse device stack according to the present embodiment, after etching the passivation material of the trench for stack isolation ((b) of FIG. 11)), the first insulating layers of the stacked structure are selectively etched until the semiconductor body (i.e., channel) is exposed (step 192, (c) of FIG. 11), the exposed semiconductor body is etched (step 193, (d) of FIG. 11), and then the regions in which the first insulating layers and the semiconductor body have been etched are again filled with an oxide material (step 194, (e) and (f) of FIG. 11). In this way, by further providing the above-described steps 192 to 194, a three-dimensional synapse device stack in which a semiconductor body is not formed on the surface of the first insulating layers is manufactured.

FIGS. 12A and 12B are cross-sectional views in first and second directions illustrating another embodiment of a channel hole in a three-dimensional synapse device stack according to a preferred embodiment of the present invention.

Referring to FIGS. 12A and 12B, a region in which synapse devices are formed among the surface of the channel hole protrudes toward the sources, drains, and first and second word lines and extends. In addition, the semiconductor body is provided on the entire surface of the channel hole, so that the semiconductor body is formed of a thin layer in a zigzag shape in a vertical direction.

On the other hand, the three-dimensional synapse device stack according to a preferred embodiment of the present invention, it is preferable to further include a body landing pad 180, a source electrode landing pad 190 and a drain electrode landing pad 192.

FIGS. 13A and 13B are cross-sectional views in first and second directions showing body landing pad, source and drain electrode landing pads in a three-dimensional synapse device stack according to a preferred embodiment of the present invention. FIGS. 14A and 14B are cross-sectional views in first and second directions showing body landing pad, source and drain electrode landing pads in a structure having a channel hole of FIGS. 12A and 12B in a three-dimensional synapse device stack according to a preferred embodiment of the present invention.

Referring to FIGS. 13A, 13B, 14A and 14B, the body landing pad 180 is positioned on the first oxide layer (Oxide 1) positioned below the channel hole, and is electrically connected to the semiconductor body. The source electrode landing pad 190 is positioned on the first oxide layer positioned below the source line electrode, and is electrically connected to the source line electrode. In addition, the drain electrode landing pad 192 is positioned on the first oxide layer positioned below the drain line electrode, and is electrically connected to the drain line electrode.

The source and drain electrode landing pads and the body landing pad are made of an electrically conductive material, and for example, may be made of one of various metals, silicides, or semiconductor material doped with impurities. The semiconductor material may include an amorphous semiconductor, a single crystal semiconductor, a polycrystalline semiconductor, and the like.

FIGS. 15A and 15B are cross-sectional views illustrating other embodiments of word lines in a three-dimensional synapse device stack according to a preferred embodiment of the present invention.

Referring to FIGS. 15A and 15B, preferably the word lines (WL1 and WL2) have at least a predetermined length from a side surface of the channel hole. Accordingly, a region adjacent to the channel hole among the word lines protrudes toward the fourth oxide layer (Oxide 4) which is a stack isolation region, compared to a region not adjacent to the channel hole among the word lines. In this case, the point where the protruding area and the non-protruding area of the word line meet each other is perpendicular to each other as shown in FIG. 15A or inclined to each other at an arbitrary angle as shown in FIG. 15B. As such, by configuring only the region adjacent to the channel hole among the word lines to protrude, it is possible to alternately arrange the adjacent three-dimensional synapse device stacks having different word lines in a zigzag form. As a result, the degree of integration of the entire array structure can be improved. Also, during the manufacturing process, during the wet etching process for forming the word lines, damage to the channel hole adjacent to the word lines and the source and drain electrodes may be minimized.

<3D Stackable Synapse Array>

The three-dimensional stacked synapse array according to the present invention may be configured by sequentially arranging the three-dimensional synapse device stack having the above-described structure. And, an AND-type synapse array or a NOR-type synapse array may be configured according to the arrangement direction of the source line electrode and the drain line electrode connected to each three-dimensional synapse device stack.

On the other hand, the three-dimensional stacked synapse array according to the present invention may further include a three-dimensional capacitor stack having the same structure as the three-dimensional synapse device stack in the peripheral circuit of the three-dimensional stacked synapse array.

FIGS. 16A and 16B are schematic diagrams illustrating an AND-type synapse array architecture and a NOR-type synapse array architecture constructed using three-dimensional stackable synapse arrays using a three-dimensional synaptic stack according to the present invention.

Referring to FIG. 16A, in the AND-type synapse array architecture, the source line electrodes (SLs) and the drain line electrodes (DLs) connected to each synapse device stack are arranged in a side-by-side direction, the word lines (WLs) are placed on both sides of the stack, and SLs. DLs and WLs are all arranged electrically separated. Referring to FIG. 16B, in the NOR-type synapse array architecture, the source line electrodes (SLs) and the drain line electrodes (DLs) connected to each synapse device stack are disposed in a direction perpendicular to each other, the word lines (WLs) are placed on both sides of the stack, and SLs, DLs and WLs are all arranged electrically isolated.

FIGS. 17A and 17B are a cross-sectional view and an equivalent circuit diagram illustrating an example of an AND-type synapse array structure in a three-dimensional stackable synapse array according to the present invention.

Referring to FIGS. 17A and 17B, in the AND-type synapse array according to the present invention, the drain line electrodes (DL1, DL2, DL3) and the source line electrodes (SL1, SL2, SL3) connected to each synapse device stack are arranged in a direction parallel to each other, and the word lines (WL1 to WL8) are arranged such that the stack structures are repeatedly arranged.

FIGS. 18A and 18B are a cross-sectional view and an equivalent circuit diagram illustrating an example of a compact AND-type synapse array structure in a three-dimensional stackable synapse array according to the present invention.

Referring to FIGS. 18A and 18B, the AND type synapse array according to the present invention is characterized in that one source line electrode is shared by two drain line electrodes. Accordingly, in the array structure according to the present embodiment, two channel holes spaced apart from each other are provided, a source line electrode is provided between the channel holes, and each drain line electrode is provided outside the channel holes, so that two drain line electrodes on the outsides of the channel holes can share one source line electrode.

FIGS. 19A and 19B are a cross-sectional view and an equivalent circuit diagram illustrating an example of a structure of a NOR-type synapse array in a three-dimensional stackable synapse array according to the present invention.

Referring to FIGS. 19A and 19B, in the NOR-type synapse array according to the present invention, the drain line electrodes (DL1, DL2, DL3) and the source line electrodes (SL1, SL2, SL3, SL4) connected to each synapse device stack are disposed in a direction perpendicular to each other, and the word lines (WL1 to WL8) are arranged such that the stack structures are repeatedly arranged.

FIGS. 20A and 20B are a cross-sectional view and an equivalent circuit diagram illustrating an example of a compact NOR-type synapse array structure in a three-dimensional stackable synapse array according to the present invention.

Referring to FIGS. 20A and 20B, the NOR-type synapse array according to the present invention is characterized in that two drain line electrodes share one source line electrode. Accordingly, in the array structure according to the present embodiment, two channel holes spaced apart from each other are provided, a source line electrode is provided between the channel holes, and each drain line electrode is provided outside the channel holes, so that two drain line electrodes on outsides of the channel holes can share one source line electrode.

FIG. 21A is a schematic diagram illustrating an example of an AND-type synapse array structure in a three-dimensional stackable synapse array according to the present invention; and FIG. 21B is a schematic diagram illustrating an example of a NOR-type synapse array structure as a whole.

Referring to FIGS. 21A and 21B, in AND-type and NOR-type synapse arrays, source line electrodes (SL1-SL5) and drain line electrodes (DL1-DL3) connected to each synapse device stack are respectively disposed on the upper portion of the array structure, and word line electrodes (WLs) are disposed on one side.

Figure 22:
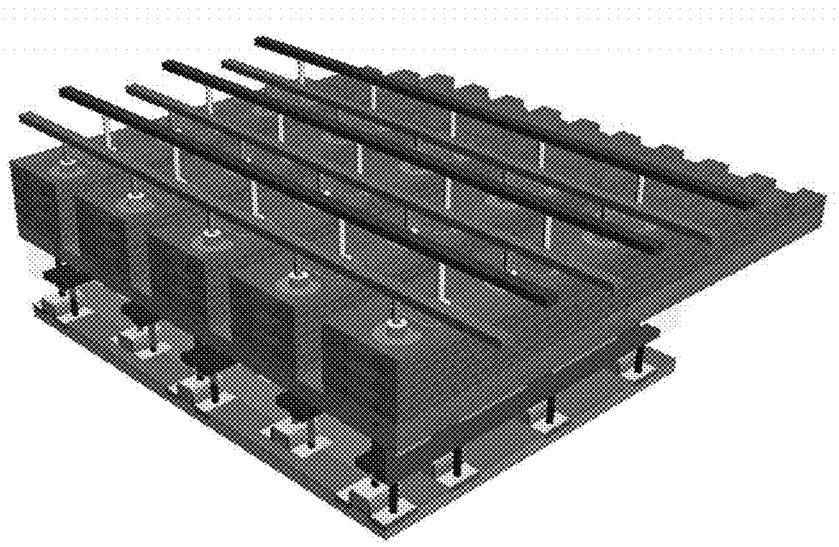
FIG. 22 is a schematic diagram showing an example of an AND-type synapse array structure provided on a CMOS integrated circuit in the three-dimensional stackable synapse array according to the present invention.

FIG. 22 is a schematic diagram showing an example of an AND-type synapse array structure provided on a CMOS integrated circuit in the three-dimensional stackable synapse array according to the present invention.

Referring to FIG. 22, a three-dimensional stacked synapse array according to the present invention is provided on a peripheral circuit implemented in CMOS integrated circuit, and source line electrodes (SLs) and drain line electrodes (DLs) are disposed on the upper portion of the three-dimensional stacked synapse array, the MOSFET devices for CMOS integrated circuit are arbitrarily arranged below the array. The MOSFET devices disposed on the lower part are connected as needed to form an integrated circuit, and the integrated circuits operate the upper three-dimensional stackable synapse array and perform necessary operations. In addition, the above-described body landing pad, source line landing pad, drain line landing pad or wires are disposed between the integrated circuit under the substrate and the three-dimensional stacked synapse array on the substrate to increase the degree of freedom of wiring.

<Selective Program and Selective Erase Operations>

Hereinafter, in the three-dimensional stacked synapse array according to the present invention, selective program and selective erase operations for a target device will be described with reference to the accompanying drawings.

Figure 23:
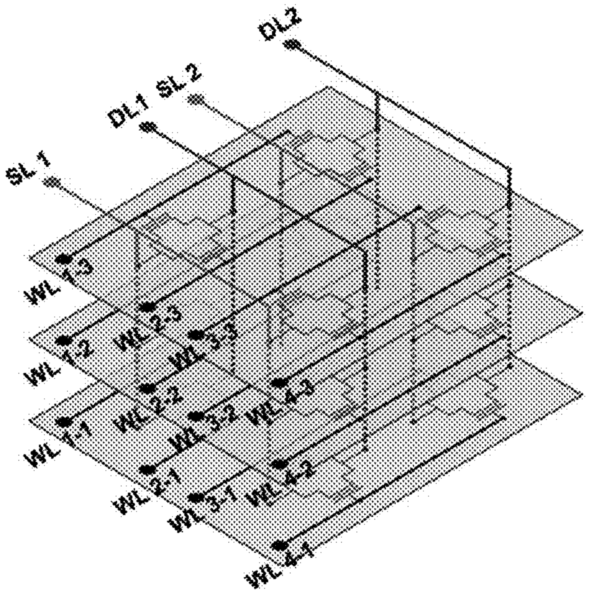
FIG. 23 is an equivalent circuit diagram of an example of an array structure in a three-dimensional stackable synapse array according to a preferred embodiment of the present invention.

FIG. 23 is an equivalent circuit diagram of an example of an array structure in a three-dimensional stackable synapse array according to a preferred embodiment of the present invention.

The three-dimensional stacked synapse array shown in FIG. 23 is an AND-type synapse array structure in which three layers are vertically stacked and four pairs of synapse devices are horizontally provided, and 12 WLs, 2 SLs, and 2 DLs are provided.

Hereinafter, in the three-dimensional stacked synapse array according to the present invention, a selective program and erase operation in the Z-axis direction, which is an operating method of an individual layer, will be described.

FIGS. 24A and 24B are an equivalent circuit diagram and a table showing voltages applied to each terminal for explaining a selective program operation among individual layer operating methods in the three-dimensional stackable AND synapse array structure shown in FIG. 23.

Referring to FIGS. 24A and 24B, first, a preset program voltage ($V_{PGM}$) is applied to the WL of a layer on which a program operation is to be performed, 0 V is applied to each of SL and DL connected to WL, so that electrons are injected using the F-N tunneling mechanism. At this time, 0 V is applied to WLs of the other layer to prevent program operation. Here, $V_{PGM}$ is a positive voltage large enough to cause F-N tunneling in the insulator stack that separates the WL line and the body region.

FIGS. 25A and 25B are graphs of the read results for the synapse device (CELL A) that has performed a program operation according to the selective program operation according to FIGS. 24A and 24B and the synapse device (CELL B) that does not have the program operation.

Referring to FIGS. 25A and 25B, SL1 and DL1 are grounded, a $V_{PGM}$ pulse is applied to WL1-3, which is a word line of a device to be written, and 0 V is applied to the remaining WL1-1 and WL1-2 to store electrons only in the charge storage layer of the $3^{rd}$ layer, and then the device of each layer is read and the result is displayed as a graph. At this time, a turn-on voltage is applied only to the WL of the device to be read and 0V is applied to the WL of the remaining devices to measure the current flowing through DL1. FIG. 25A is a graph of a read result for CELL A, which is a device that has performed a program operation. In FIG. 25A, the left line is the current in the initial state, and the right line is the current after the program operation. Referring to FIG. 25A, it can be seen that the current flowing through CELL A is changed from the initial state after the program operation. Meanwhile, FIG. 25B is a graph of a read result for CELL B, which is a device that has not performed a program operation. Referring to FIG. 25B, it can be confirmed that the current flowing through CELL B after the selective program operation on CELL A is the same as the initial state. That is, since FN tunneling does not occur in CELL A's neighbor CELL B, the graph hardly changes.

FIGS. 26A and 26B are an equivalent circuit diagram and a table showing voltages applied to each terminal for explaining a selective erase operation among individual layer operating methods in the three-dimensional stacked AND synapse array structure shown in FIG. 23.

Referring to FIGS. 26A and 26B, in the structure according to the present invention, holes are generated using a hot-hole injection (HHI) mechanism. 0V is applied to the WL of the device to be erased and a preset erase voltage ($V_{ERS}$) is applied to the connected DL and SL to generate and inject holes by the GIDL (Gate Induced Drain Leakage) current. At this time, a preset inhibition voltage $V_{INH}$ is applied to the WLs of the other layer to prevent hole injection. Here. $V_{ERS}$ is a positive voltage large enough that holes are generated by GIDL (Gate Induced Drain Leakage) current between the WL line and the DL line and these holes are injected into the insulator stack, and $V_{INH}$ is a voltage that prevents the generated holes from being injected into the insulator stack of an adjacent device, and is generally preferably half of the $V_{ERS}$ value.

FIGS. 27A and 27B are graphs of read results for the synapse device CELL A that has performed an erase operation according to the selective Erase operation shown in FIGS. 26A and 26B and the synapse device CELL B that has not performed the erase operation.

Referring to FIGS. 27A and 27B, $V_{ERS}$ pulses are applied to SL1 and DL1, 0 V is applied to WL1-3, and $V_{INH}$ is applied to the remaining WL1-1 and WL1-2 to inject holes only into the charge storage layer of the third layer, and then the device of each layer is read and the result is displayed as a graph. FIG. 27A is a graph of a read result for CELL A, which a device that has performed an erase operation. In FIG. 27A, the right line is the current in the initial state, and the left line is the current after the erase operation. Referring to FIG. 27A, it can be seen that the current flowing through CELL A increases and changes from the initial state after the erase operation. Meanwhile, FIG. 27B is a graph of a read result for CELL B, which is a device that has not performed an erase operation. Referring to FIG. 27B, it can be confirmed that the current flowing through CELL B after the selective erasing operation on CELL A is the same as the initial state. That is, the HHI mechanism does not occur in CELL B adjacent to CELL A, so that the graph hardly changes.

Hereinafter, in the three-dimensional stacked synapse array according to the present invention, an operating method according to each position, selective writing (Program) and erasing (Erase) operations in the XY-axis direction will be described.

FIGS. 28A and 28B are an equivalent circuit diagram and a table showing voltages applied to each terminal for explaining a selective program operation among operating methods according to positions in the three-dimensional stackable AND synapse array structure shown in FIG. 23.

Referring to FIGS. 28A and 28B, similarly to the layer-by-layer operating method of FIGS. 24A and 24B, a preset program voltage ($V_{PGM}$) is first applied to the WL of the device to be written (Program), and 0V is applied to each of SL and DL of the device to be written. Then, 0 V is applied to the other neighboring WLs and a preset inhibition voltage Vi is applied to DL and SL to block the program operation.

FIGS. 29A and 29B are graphs of read results for the synapse device (CELL A) that has performed a program operation according to the selective program operation according to FIGS. 28A and 28B and the synapse device (CELL B) that does not perform the program operation.

Referring to FIGS. 29A and 29B, SL1 and DL1 are grounded, $V_{PGM}$ pulses are applied to WL1-WL3, 0 V is applied to the remaining WLs, and $V_{INH}$ is applied to other DLs and SLs to store electrons only in the charge storage layer of CELL A, and then the device of each layer is read and the result is displayed as a graph. At this time, a turn-on voltage is applied only to the WL of the device to be read and 0V is applied to the WLs of the remaining devices to measure the current flowing through the DL. Referring to FIG. 29A, it can be seen that the current flowing through CELL A decreases and changes from the initial state after the program operation. Meanwhile, referring to FIG. 29B, it can be confirmed that the current flowing through CELL B after the selective program operation on CELL A is the same as the initial state. That is, since FN tunneling does not occur in CELL B adjacent to CELL A, the graph hardly changes.

FIG. 30 is an equivalent circuit diagram and a table showing voltages applied to each terminal for explaining a selective erase operation among operating methods according to a position in the three-dimensional stackable AND synapse array structure shown in FIG. 23.

Referring to FIGS. 30A and 30B, also during the erase operation, in the structure according to the present invention, holes are generated using a hot-hole injection (HHI) mechanism. A preset $V_{ERS}$ voltage is applied to DL and SL of the device to be erased, and 0V is applied to WL to inject holes. 0 V is applied to the neighboring DLs and SLs, and a preset $V_{INH}$ is applied to the neighboring WLs to prevent hole injection.

FIGS. 31A and 31B are graphs of read results for the synapse device CELL A that has performed an erase operation according to the selective erase operation of FIGS. 30A and 30B and the synapse device CELL B that has not performed the erase operation.

Referring to FIGS. 31A and 31B, a $V_{ERS}$ pulse is applied to SL1 and DL1, 0 V is applied to WL1-3, $V_{IHN}$ is applied to the remaining WLs, and 0 V is applied to the remaining DLs and SLs to inject holes only into the charge storage layer of device. It is the result of reading the device of each layer after injecting. Referring to FIG. 31A, it can be seen that the current flowing through CELL A increases and changes from the initial state after the erase operation. Meanwhile, referring to FIG. 31B, it can be confirmed that the current flowing through CELL B after the selective erasing operation on CELL A is the same as the initial state.

That is, the HHI mechanism does not occur in CELL A's neighbor CELL B, so that the graph hardly changes.

In the above, the present invention has been described with respect to the preferred embodiment thereof, but this is only an example and does not limit the present invention. It will be appreciated that various modifications and applications not exemplified above are possible within the scope. And, the differences related to such modifications and applications should be construed as being included in the scope of the present invention defined in the appended claims.

What is claimed is:

1. A three-dimensional synapse device stack comprising:

a channel hole disposed on a substrate, the channel hole extending in a direction perpendicular to a surface of the substrate, having a pillar shape, and having an interior filled with an insulating material;

a semiconductor body disposed on an outer circumferential surface of the channel hole and made of a semiconductor material;

a plurality of first insulating layers at least partially in contact with the semiconductor body;

a plurality of sources disposed on a first side of an outer circumferential surface of the semiconductor body and stacked alternately with the first insulating layers;

a source line electrode electrically connected to the plurality of sources;

a plurality of drains disposed on a second side of the outer circumferential surface of the semiconductor body, the second side being opposite to the first side and stacked alternately with the first insulating layers;

a drain line electrode electrically connected to the plurality of drains;

a plurality of first word lines disposed on a third side of the outer circumferential surface of the semiconductor body, the third side being positioned between the sources and the drains and stacked alternately with the first insulating layers;

a plurality of first insulator stacks disposed between the first word lines and the semiconductor body and including at least one layer for storing charges or causing polarization;

a plurality of second word lines disposed on a fourth side of the outer circumferential surface of the semiconductor body, the fourth side being positioned between the sources and the drains and spaced apart from the third side and stacked alternately with the first insulating layers; and a plurality of second insulator stacks disposed between the second word lines and the semiconductor body and including at least one layer for storing charges or causing polarization, wherein the semiconductor body, a source, a drain, a first insulator stack and a first word line located at a same level on the surface of the channel hole constitute a first synapse device, and a plurality of first synapse devices stacked along the channel hole constitute a first synapse device stack, wherein the semiconductor body, a source, a drain, a second insulator stack and a second word line located at a same level on the surface of the channel hole constitute a second synapse device, and a plurality of second synapse devices stacked along the channel hole constitute a second synapse device stack, and wherein a first synapse device and a second synapse device located at a same level share a source and a drain, and respectively include a first word line and a second word line spaced apart from each other, and each of the word lines is electrically isolated from adjacent synapse device stacks.

2. A three-dimensional stackable synapse array, comprising a plurality of the three-dimensional synapse device stacks according to claim 1 arranged in an array.

3. The three-dimensional stackable synapse array according to claim 2, wherein the three-dimensional stackable synapse array is configured as an AND-type synapse array by arranging source line electrodes and drain line electrodes connecting the three-dimensional synapse device stacks side by side, or as a NOR-type synapse array by arranging the source line electrodes and the drain line electrodes connecting the three-dimensional synapse device stacks to intersect each other.

4. The three-dimensional stackable synapse array according to claim 2, further comprising a three-dimensional capacitor stack having a same structure as the three-dimensional synapse device stack.

5. The three-dimensional stackable synapse array according to claim 2, further comprising a CMOS integrated circuitry configured as a peripheral circuitry and disposed under the substrate.

6. The three-dimensional synapse device stack according to claim 1, wherein the semiconductor body is absent from side surfaces of the first insulating layers positioned between adjacent word lines, and adjacent word lines of the synapse devices are electrically isolated from each other.

7. The three-dimensional synapse device stack according to claim 1, wherein a region of the channel hole on which the synapse devices are provided protrudes toward the sources, the drains, and the word lines, the semiconductor body is disposed only on the protruding region of the channel hole and is absent from a non-protruding region of the channel hole, and adjacent word lines of the synapse devices are electrically isolated from each other.

8. The three-dimensional synapse device stack according to claim 1, wherein a region of the channel hole on which the synapse devices are provided protrudes toward the sources, the drains, and the word lines, the semiconductor body is disposed on the surface of the channel hole, but is absent from side surfaces of the first insulating layers positioned between the word lines, and the adjacent word lines of the synapse devices are electrically isolated from each other.

9. The three-dimensional synapse device stack according to claim 1, wherein a region of the channel hole on which the synapse devices are provided protrudes toward the sources, the drains, and the word lines.

10. The three-dimensional synapse device stack according to claim 1, wherein each of the insulator stacks comprises a single insulating layer or a stack structure in which a plurality of layers are stacked; and wherein, when each of the insulator stacks is configured as a stack structure, each of the insulator stacks comprises at least a charge storage layer and an insulating layer, at least a ferroelectric layer and an insulating layer, at least a resistance change layer and an insulating layer, or at least a phase change layer and an insulating layer.

11. The three-dimensional synapse device stack according to claim 1, further comprising a body landing pad positioned on an oxide layer of the substrate, wherein the body landing pad comprises an electrically conductive material and is electrically connected to the semiconductor body.

12. The three-dimensional synapse device stack according to claim 1, further comprising a source electrode landing pad and a drain electrode landing pad positioned in an oxide layer of the substrate, wherein the source electrode landing pad comprises an electrically conductive material and is electrically connected to the source line electrode, and the drain electrode landing pad comprises an electrically conductive material and is electrically connected to the drain line electrode.

* * * * *